(12) United States Patent
Kashima et al.

(10) Patent No.: US 10,937,803 B2
(45) Date of Patent: Mar. 2, 2021

(54) SEMICONDUCTOR STORAGE DEVICE AND METHOD OF MANUFACTURING SEMICONDUCTOR STORAGE DEVICE

(71) Applicant: TOSHIBA MEMORY CORPORATION, Minato-ku, Tokyo (JP)

(72) Inventors: Takayuki Kashima, Yokkaichi Mie (JP); Kohei Nyui, Yokkaichi Mie (JP); Kotaro Fujii, Yokkaichi Mie (JP); Hiroyuki Yamasaki, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/530,741

(22) Filed: Aug. 2, 2019

(65) Prior Publication Data

US 2020/0273876 A1     Aug. 27, 2020

(30) Foreign Application Priority Data

Feb. 21, 2019   (JP) .............................. JP2019-029692

(51) Int. Cl.
| | |
|---|---|
| *H01L 27/1157* | (2017.01) |
| *H01L 27/11582* | (2017.01) |
| *G11C 5/06* | (2006.01) |
| *H01L 27/11556* | (2017.01) |
| *H01L 27/11524* | (2017.01) |

(52) U.S. Cl.
CPC ........ *H01L 27/11582* (2013.01); *G11C 5/063* (2013.01); *H01L 27/1157* (2013.01); *H01L 27/11524* (2013.01); *H01L 27/11556* (2013.01)

(58) Field of Classification Search
CPC .......... H01L 27/11582; H01L 27/1157; H01L 27/11556; H01L 27/11524
See application file for complete search history.

(56) References Cited

U.S. PATENT DOCUMENTS

| | | | |
|---|---|---|---|
| 7,847,342 | B2 | 12/2010 | Fukuzumi et al. |
| 8,847,303 | B2 | 9/2014 | Kito et al. |
| 9,570,460 | B2 | 2/2017 | Kanakamedala et al. |
| 2018/0358102 | A1 | 12/2018 | Zhang et al. |
| 2019/0081060 | A1 | 3/2019 | Lu et al. |
| 2019/0131315 | A1 | 5/2019 | Sun et al. |

*Primary Examiner* — Douglas M Menz
(74) *Attorney, Agent, or Firm* — Foley & Lardner LLP

(57) ABSTRACT

According to one embodiment, a semiconductor storage device includes a stacked body, a first semiconductor layer extending in the stacked body, a first charge storage layer disposed between the plurality of first conductor layers and the first semiconductor layer, a second conductor layer disposed above the stacked body, a second semiconductor layer extending through the second conductor layer, a third conductor layer disposed between the second semiconductor layer and the second conductor layer, a first insulator layer disposed above the third conductor layer, and a second insulator layer including a first portion disposed between the second semiconductor layer and the third conductor layer and a second portion disposed between the second semiconductor layer and the first insulator layer. A diameter of the second insulator layer is larger in the second portion than in the first portion.

17 Claims, 37 Drawing Sheets

SEMICONDUCTOR STORAGE DEVICE AND METHOD OF MANUFACTURING SEMICONDUCTOR STORAGE DEVICE

CROSS-REFERENCE TO RELATED APPLICATION(S)

This application is based upon and claims the benefit of priority from Japanese Patent Application No. 2019-029692, filed Feb. 21, 2019, the entire contents of which are incorporated herein by reference.

FIELD

Embodiments described herein relate generally to a semiconductor storage device and a method of manufacturing the semiconductor storage device.

BACKGROUND

A NAND flash memory is known as a semiconductor storage device capable of storing data in a nonvolatile manner. In a semiconductor storage device such as the NAND flash memory, a three-dimensional memory structure is being adopted for higher integration and higher capacity. In the three-dimensional memory structure, for example, a plurality of memory holes are provided on a substrate, and a memory cell group (NAND string) including a plurality of memory cells is disposed in each of the memory holes. One end of the memory cell group is connected to a wire through a contact hole.

An example of related art includes U.S. Pat. No. 9,570,460.

DETAILED DESCRIPTION

Figure 1:
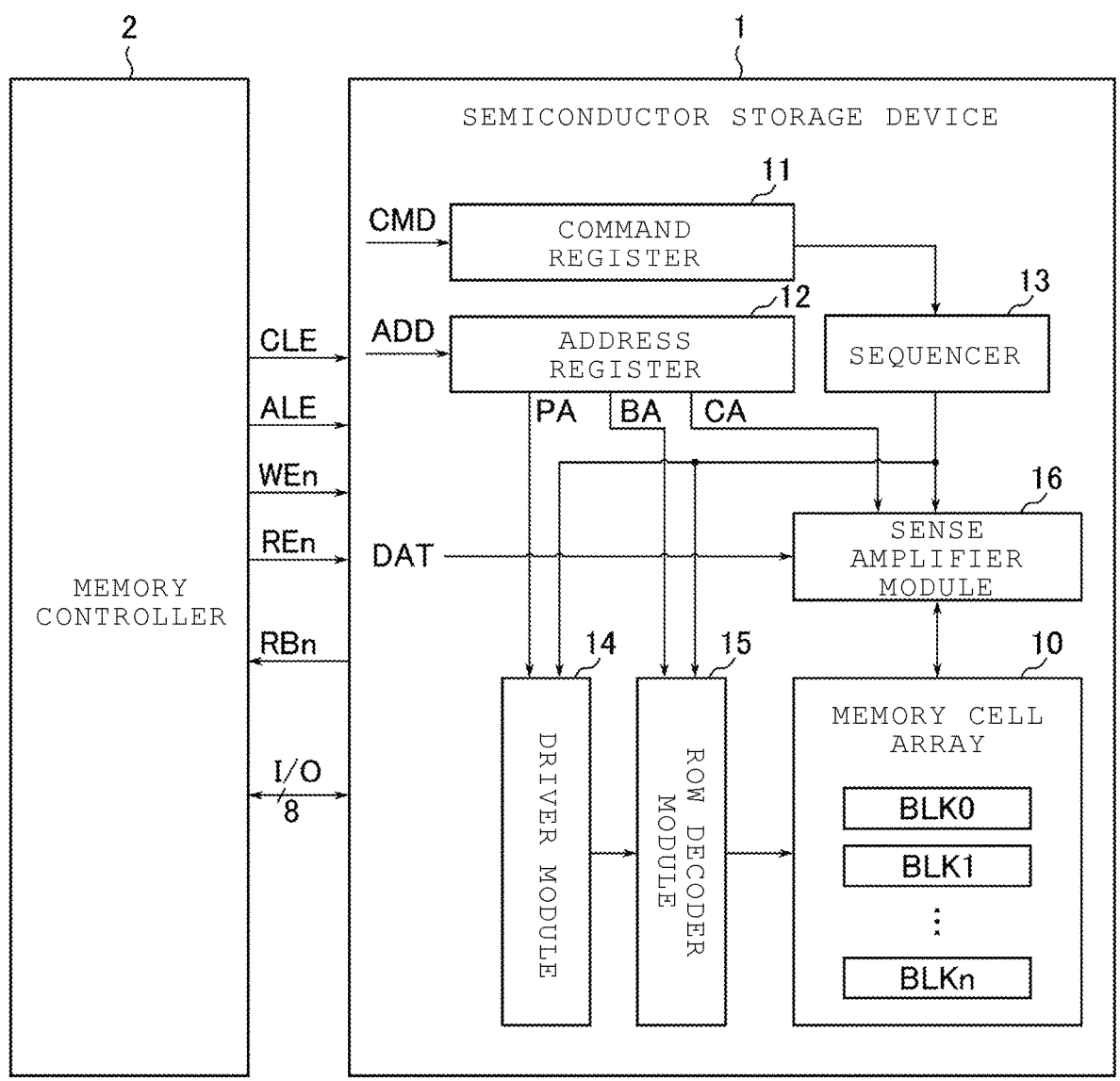
FIG. 1 is a block diagram showing an entire configuration of a memory system including a semiconductor storage device according to a first embodiment.

Embodiments provide a semiconductor storage device including a contact hole capable of preferably connecting a memory cell and a wire with each other and a method of manufacturing the semiconductor storage device.

In general, according to one embodiment, a semiconductor storage device includes a plurality of first conductor layers stacked in a first direction, a first semiconductor layer extending in the first direction through the plurality of first conductor layers, a first charge storage layer disposed between the plurality of first conductor layers and the first semiconductor layer, a second conductor layer disposed above an uppermost layer of the plurality of first conductor layers, a second semiconductor layer extending in the first direction through the second conductor layer and electrically connected to the first semiconductor layer, a third conductor layer disposed between the second semiconductor layer and the second conductor layer, the third conductor layer electrically connected to the second conductor layer, a first insulator layer disposed above the third conductor layer, and a second insulator layer including a first portion disposed between the second semiconductor layer and the third conductor layer, and including a second portion disposed between the second semiconductor layer and the first insulator layer, the second insulator layer being a continuous film from at least the first portion to the second portion. The first portion of the second insulator layer has a first diameter. The second portion of the second insulator layer has a second diameter. The second diameter is greater than the first diameter.

Hereinafter, an embodiment will be described with reference to the drawings. Each embodiment illustrates a device or a method for embodying a technical idea of the disclosure. The drawings are schematic or conceptual, and the dimensions and proportions of the drawings are not necessarily the same as the actual ones. The technical concept of the present disclosure is not specified by the shape, structure, arrangement, and the like of the components.

In the following description, components having substantially the same function and configuration are denoted by the same reference numerals. The numbers after the letters configuring the reference numerals are referred to by the reference numerals including the same letter and are used to distinguish between elements having similar configurations. If it is not necessary to distinguish between elements indicated by reference signs including the same letter, such elements are referred to by reference numerals including only letters, respectively.

1. First Embodiment

A semiconductor storage device according to the first embodiment will be described.

1.1 Configuration

First, a configuration of the semiconductor storage device according to the first embodiment will be described.

1.1.1 Semiconductor Storage Device

FIG. 1 is a block diagram illustrating the configuration of the semiconductor storage device according to the first embodiment. A semiconductor storage device 1 is a NAND type flash memory capable of storing data in a non-volatile manner, and is controlled by an external memory controller 2. Communication between the semiconductor storage device 1 and the memory controller 2 supports, for example, a NAND interface standard.

As shown in FIG. 1, the semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer equal to or greater than 1). The block BLK is a set of a plurality of memory cells capable of storing data in a non-volatile manner, and is used, for example, as a data erasure unit. The memory cell array 10 is also provided with a plurality of bit lines and a plurality of word lines. Each memory cell is associated with, for example, one bit line and one word line. The detailed configuration of the memory cell array 10 will be described later.

The command register 11 stores a command CMD received by the semiconductor storage device 1 from the memory controller 2. The command CMD includes, for example, an instruction to cause the sequencer 13 to execute a read operation, a write operation, an erase operation, and the like.

The address register 12 stores address information ADD received by the semiconductor storage device 1 from the memory controller 2. The address information ADD includes, for example, a block address BA, a page address PA, and a column address CA. For example, the block address BA, the page address PA, and the column address CA are used to select the block BLK, the word line, and the bit line, respectively.

The sequencer 13 controls the overall operation of the semiconductor storage device 1. For example, the sequencer 13 controls the driver module 14, the row decoder module 15, the sense amplifier module 16, and the like based on the command CMD stored in the command register 11 to execute the read operation, the write operation, the erase operation, and the like.

The driver module 14 generates a voltage used in the read operation, the write operation, the erase operation, and the like. The driver module 14 applies the generated voltage to a signal line corresponding to the selected word line based on, for example, the page address PA stored in the address register 12.

The row decoder module 15 selects one block BLK in the corresponding memory cell array 10 based on the block address BA stored in the address register 12. For example, the row decoder module 15 transmits the voltage applied to the signal line corresponding to the selected word line to the selected word line in the selected block BLK.

The sense amplifier module 16 applies a desired voltage to each bit line according to write data DAT received from the memory controller 2 in the write operation. In the read operation, the sense amplifier module 16 determines the data stored in the memory cell based on the voltage of the bit line, and transmits a determination result to the memory controller 2 as the read data DAT.

The semiconductor storage device 1 and the memory controller 2 described above may be implemented by one semiconductor device which is a combination of the semiconductor storage device 1 and the memory controller 2. Examples of such a semiconductor device include a memory card such as an SD™ card, a solid state drive (SSD), and the like.

1.1.2 Circuit Configuration of Memory Cell Array

Figure 2:
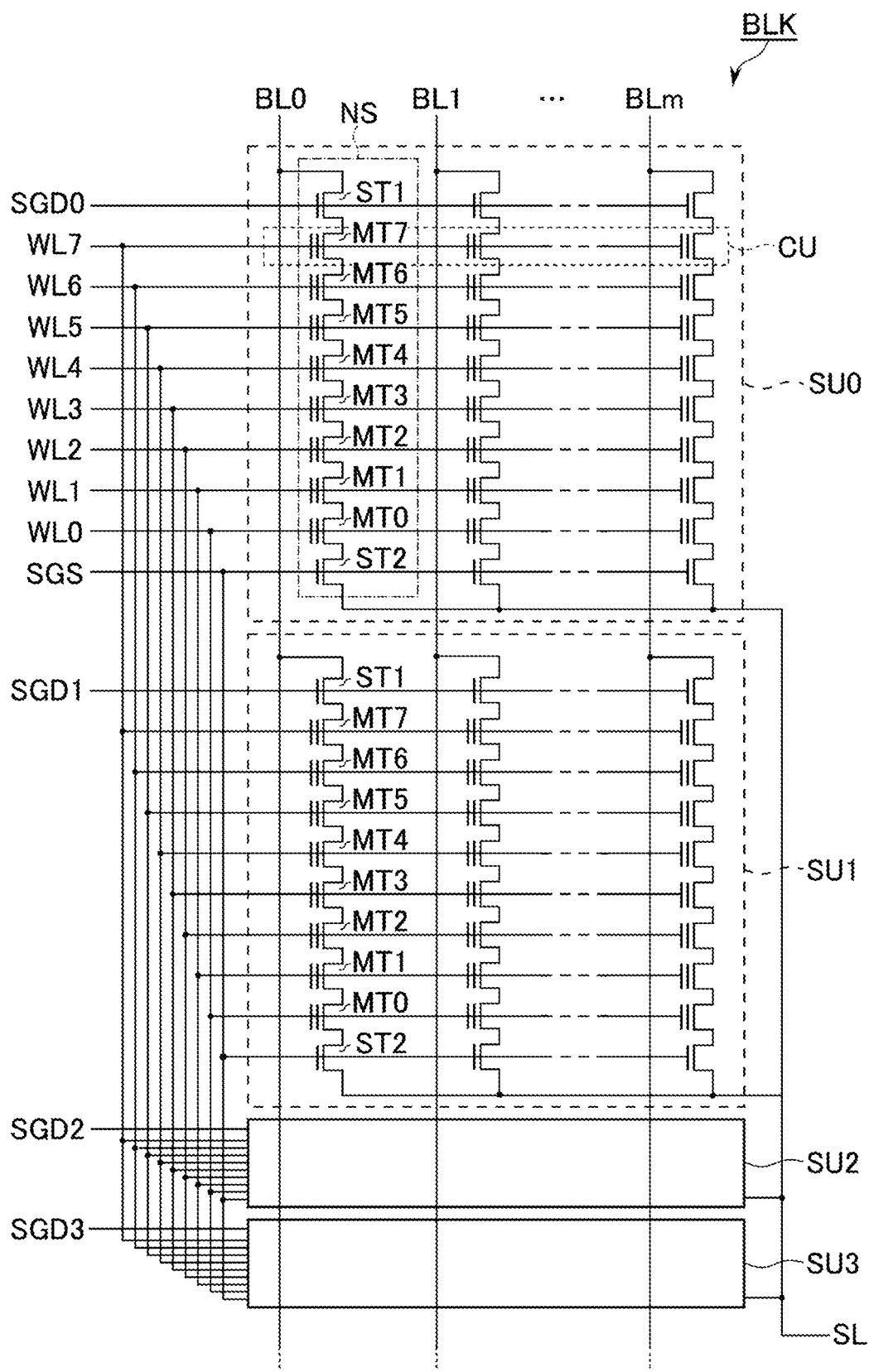
FIG. 2 is a circuit diagram showing a portion of a memory cell array of the semiconductor storage device of the first embodiment.

FIG. 2 is a circuit diagram illustrating a configuration of the memory cell array of the semiconductor storage device according to the first embodiment. FIG. 2 shows one block BLK among the plurality of blocks BLK in the memory cell array 10.

As shown in FIG. 2, the block BLK includes, for example, four string units SU0 to SU3. Each string unit SU includes a plurality of NAND strings NS respectively associated with bit lines BL0 to BLm (m is an integer equal to or greater than 1). Each NAND string NS includes, for example, memory cell transistors MT0 to MT7, and select transistors ST1 and ST2. The memory cell transistor MT includes a control gate and a charge storage layer, and stores data in a non-volatile manner. Each of select transistors ST1 and ST2 is used to select the string unit SU during various operations.

In each NAND string NS, the memory cell transistors MT0 to MT7 are connected with each other in series. A drain of the select transistor ST1 is connected to an associated bit line BL, and a source of the select transistor ST1 is connected to one end of the memory cell transistors MT0 to MT7 that are connected with each other in series. A drain of the select transistor ST2 is connected to the other end of the memory cell transistors MT0 to MT7 that are connected with each other in series. A source of the select transistor ST2 is connected to the source line SL.

In the same block BLK, control gates of the memory cell transistors MT0 to MT7 are commonly connected to the word lines WL0 to WL7, respectively. The gates of the select transistors ST1 in the string units SU0 to SU3 are commonly connected to select gate lines SGD0 to SGD3, respectively. The gates of the select transistors ST2 are commonly connected to a select gate line SGS.

In the circuit configuration of memory cell array 10 described above, the bit line BL is shared by the NAND strings NS to which the same column address is allocated in each string unit SU. The source line SL is shared, for example, among the plurality of blocks BLK.

A set of the memory cell transistors MT connected to the common word line WL in one string unit SU is referred to as, for example, a cell unit CU. For example, a storage capacity of the cell unit CU including the memory cell transistors MT each storing 1-bit data is defined as "one page data". The cell unit CU may have a storage capacity equal to or greater than two page data, according to the number of bits of the data stored in the memory cell transistor MT.

It should be noted that the circuit configuration of the memory cell array 10 provided in the semiconductor storage device 1 according to the first embodiment is not limited to the configuration described above. For example, the number of memory cell transistors MT and the number of select transistors ST1 and ST2 in each NAND string NS may be any number. The number of string units SU in each block BLK may be any number.

1.1.3 Structure of Memory Cell Array

Hereinafter, an example of the structure of the memory cell array of the semiconductor storage device according to the first embodiment will be described.

It should be noted that in the drawings referred to below, an X direction corresponds to an extending direction of the word line WL, a Y direction corresponds to an extending direction of the bit line BL, and a Z direction corresponds to a vertical direction regarding a surface of a semiconductor substrate 20 on which the semiconductor storage device 1 is formed. In a plan view, hatching is appropriately added to make the drawing easy to see. The hatching added to the plan view is not necessarily related to a material or a characteristic of the hatched component. In a cross-sectional view, components such as an insulating layer (interlayer insulating film), a wire, and a contact are appropriately omitted to make the drawing easy to see.

Figure 3:
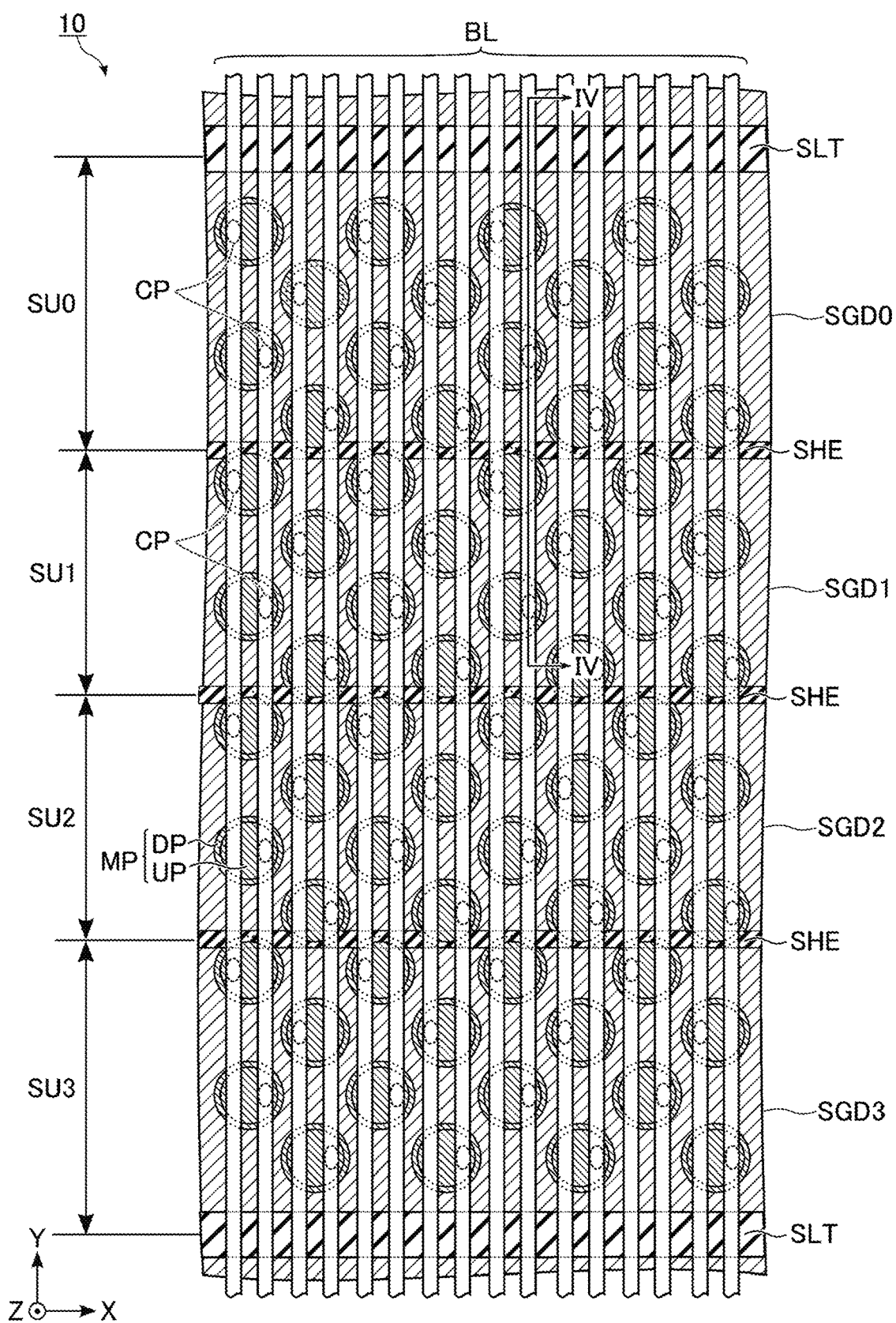
FIG. 3 is a plan view of the memory cell array of the semiconductor storage device of the first embodiment as viewed from above.

FIG. 3 is a plan view illustrating a planar layout of the memory cell array of the semiconductor storage device according to the first embodiment. In FIG. 3, as an example, a part of a region including a structure corresponding to the string units SU0 to SU3 in a certain block BLK is shown.

As shown in FIG. 3, the memory cell array 10 includes, for example, slits SLT and SHE, a memory pillar MP, a contact CP, and the bit lines BL.

Each of the plurality of slits SLT extends in the X direction and is arranged in the Y direction. Each of the plurality of slits SHE extends in the X direction and is arranged in the Y direction between adjacent slits SLT. A width of the slit SLT is, for example, wider than a width of the slit SHE. Each of the slits SLT and SHE includes an insulator. The slit SLT divides, for example, each of a wire layer corresponding to the word line WL, a wire layer corresponding to the select gate line SGD, and a wire layer corresponding to the select gate line SGS. The slit SHE divides a wire layer corresponding to the select gate line SGD.

A region divided by the slits SLT and SHE corresponds to one string unit SU. Specifically, for example, string units SU0 to SU3 are provided between the slits SLT adjacent in the Y direction. Four regions divided by the three slits SHE arranged between the slits SLT correspond to the string units SU0 to SU3, respectively. That is, the semiconductor storage device 1 includes the string unit SU sandwiched by the slits SHE. In the memory cell array 10, for example, the same layout is repeatedly disposed in the Y direction.

The plurality of memory pillars MP is disposed, for example, in a zigzag shape of 16 rows in the region between the adjacent slits SLT. Each of the memory pillars MP is provided with a portion (lower pillar LP) formed in the memory hole MH and a portion (upper pillar UP) formed in the SGD hole SH. The upper pillar UP is provided on a layer higher than the lower pillar LP, and for example, the upper pillar UP has a diameter smaller than a diameter of the lower pillar LP.

There is an overlapping portion between a set of corresponding upper pillar UP and lower pillar LP in plan view. In the plan view, the center of the corresponding upper pillar UP and the center of the lower pillar LP may or may not overlap. The memory pillar MP disposed in the vicinity of the slit SHE is provided with a portion overlapping the slit SHE. In the semiconductor storage device 1 according to the first embodiment, a layout in which the contact between the slit SHE and the memory pillar MP is allowed may be designed.

More specifically, the lower pillar LP disposed near the slit SHE may be provided with a portion overlapping the slit SHE in the plan view, and the upper pillar UP corresponding to the lower pillar LP may be provided with a portion that is in contact with the slit SHE in the plan view.

Each of the plurality of bit lines BL extends in the Y direction and is arranged in the X direction. Each bit line BL is disposed to overlap at least one upper pillar UP for each string unit SU in the plan view. In the example of FIG. 3, two bit lines BL overlap each upper pillar UP. The contact CP is provided between one of the plurality of bit lines BL overlapping the upper pillar UP and the corresponding upper pillar UP. A conductive path formed in the upper pillar UP is electrically connected to the corresponding bit line BL through the contact CP.

It should be noted that the planar layout of the memory cell array 10 described above is merely an example, and the present disclosure is not limited thereto. For example, the number of slits SHE disposed between the adjacent slits SLT may be any number. The number of string units SU between the adjacent slits SLT changes based on the number of slits SHE. The number and the arrangement of the memory pillars MP may be any number and any arrangement. The number of bit lines BL overlapping each memory pillar MP may be any number.

Figure 4:
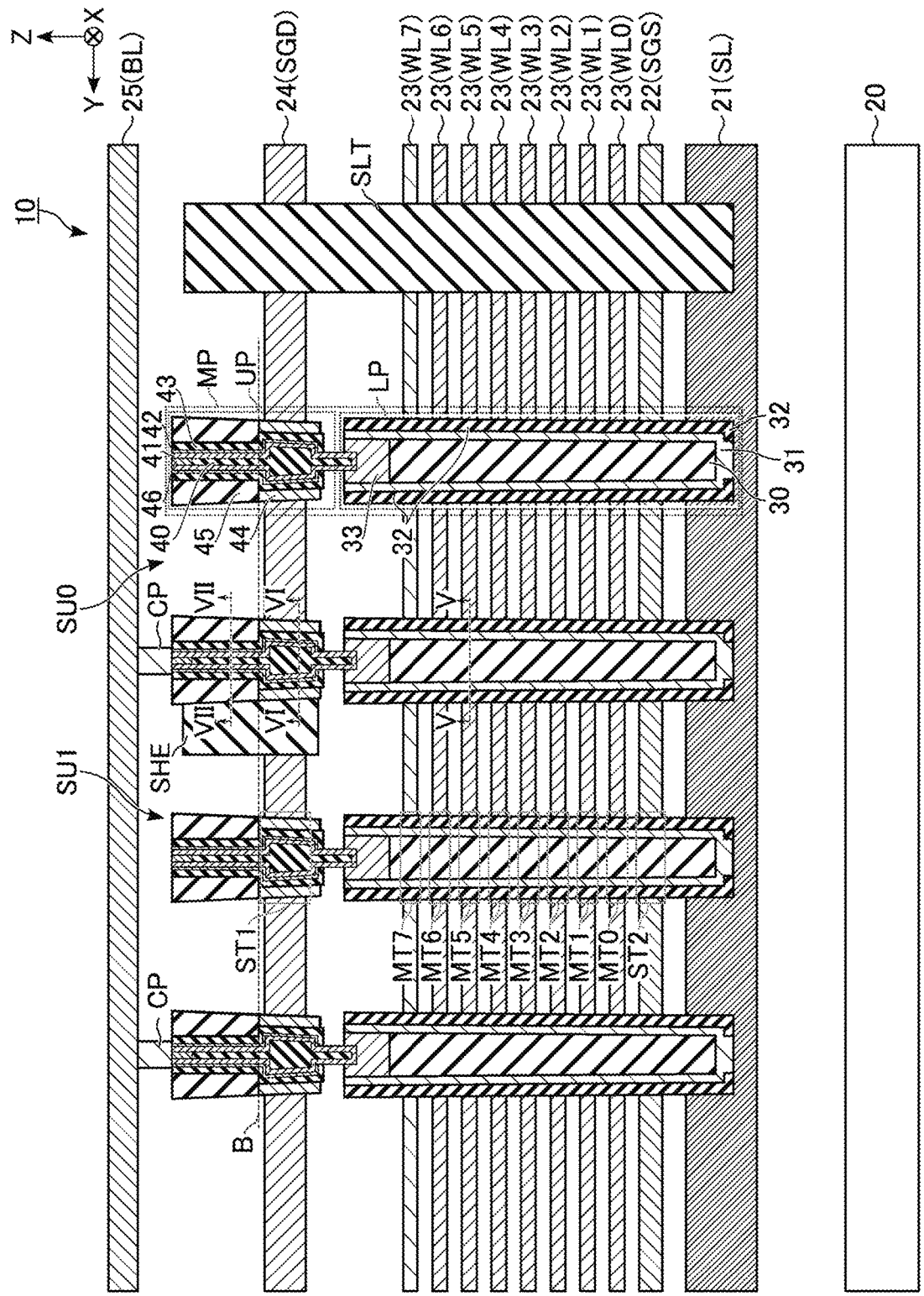
FIG. 4 is a cross-sectional view of the memory cell array along a line IV-IV of FIG. 3.

FIG. 4 is a cross-sectional view taken along a line IV-IV of FIG. 3, and shows an example of a cross-sectional structure of the memory cell array 10 of the semiconductor storage device according to the first embodiment. As shown in FIG. 4, the memory cell array 10 further includes, for example, conductor layers 21 to 25. The conductor layers 21 to 25 are provided above the semiconductor substrate 20.

Specifically, the conductor layer 21 is provided above the semiconductor substrate 20 through the insulator layer. Although not shown, for example, peripheral circuits such as the sense amplifier module 16 may be provided on the insulator layer between the semiconductor substrate 20 and the conductor layer 21. The conductor layer 21 is formed, for example, in a plate shape extended along the XY plane, and is used as the source line SL. The conductor layer 21 includes, for example, silicon (Si).

The conductor layer 22 is provided above the conductor layer 21 through the insulator layer. The conductor layer 22 is formed, for example, in a plate shape extended along the XY plane, and is used as the select gate line SGS. The conductor layer 22 includes, for example, tungsten (W).

A stacked body in which the insulator layer and the conductor layer 23 are alternately stacked is provided above the conductor layers 22. The conductor layer 23 is formed, for example, in a plate shape extended along the XY plane. For example, the plurality of stacked conductor layers 23 are used as the word lines WL0 to WL7 sequentially from a side of the semiconductor substrate 20. The conductor layer 23 includes, for example, tungsten (W).

The conductor layer 24 is provided above the conductor layer 23 of the uppermost layer through the insulator layer. A distance between the conductor layer 23 of the uppermost layer and the conductor layer 24 in the Z direction may be longer than a distance between the adjacent conductor layers 23 in the Z direction. In other words, a thickness of the insulator layer between the conductor layer 23 of the uppermost layer and the conductor layer 24 may be larger than a thickness of the insulator layer between the adjacent conductor layers 23. The conductor layer 24 is formed, for example, in a plate shape extended along the XY plane, and is used as the select gate line SGD. The conductor layer 24 includes, for example, tungsten (W).

The conductor layer 25 is provided above the conductor layer 24 through the insulator layer. For example, the conductor layer 25 is formed in a line shape extending along the Y direction, and is used as the bit line BL. That is, the plurality of conductor layers 25 is arranged in the Y direction in a region that is not shown. The conductor layer 25 includes, for example, copper (Cu).

The memory pillar MP extends along the Z direction, and penetrates the conductor layers 22 to 24. Specifically, the lower pillar LP of the memory pillar MP penetrates the conductor layers 22 and 23 and a bottom portion is in contact with the conductor layer 21. In other words, the lower pillar LP extends in the stacked body that includes the conductor layers 22 and 23 along the Z direction. The upper pillar UP of the memory pillar MP penetrates the conductor layer 24 and is in contact with the lower pillar LP. In other words, the upper pillar UP extends in the conductor layer 24 along the Z direction.

The memory pillar MP includes, for example, a core member 30, a semiconductor layer 31, a stacked film 32, a semiconductor portion 33, a core member 40, a semiconductor layer 41, a semiconductor layer 42, a stacked film 43, a conductor layer 44, an insulator layer 45, and a semiconductor portion 46. The core member 30, the semiconductor layer 31, the stacked film 32, and the semiconductor portion 33 are disposed in the lower pillar LP. The core member 40, the semiconductor layer 41, the semiconductor layer 42, the stacked film 43, the conductor layer 44, the insulator layer 45, and the semiconductor portion 46 are disposed in the upper pillar UP. The upper pillar UP and the lower pillar LP have a tapered shape, and may be electrically connected with each other through the semiconductor layer 41.

The core member 30 extends along the Z direction. An upper end of the core member 30 is located, for example, in a layer higher than a layer provided with the conductor layer 23 of the uppermost layer. A lower end of the core member 30 is located, for example, in a layer provided with the conductor layer 21. The core member 30 includes, for example, an insulator such as silicon oxide ($SiO_2$).

The semiconductor layer 31 covers a bottom surface and a side surface of the core member 30. The semiconductor layer 31 located, for example, a portion provided in a cylindrical shape. A lower end of the semiconductor layer 31 is in contact with the conductor layer 21. An upper end of the semiconductor layer 31 is located in a layer higher than the layer provided with the conductor layer 23 of the uppermost layer, and reaches an upper end of the lower pillar LP.

The stacked film 32 covers a side surface and a bottom surface of the semiconductor layer 31 except for a portion where the conductor layer 21 and the semiconductor layer 31 are in contact with each other. The stacked film 32 includes, for example, a portion provided in a cylindrical shape. A detailed layer structure of the stacked film 32 will be described later.

The semiconductor portion 33 covers an upper surface of the core member 30 and is in contact with an inner wall of a portion of the semiconductor layer 31 provided above the core member 30. The semiconductor portion 33 is provided, for example, in a cylindrical shape, and reaches the upper end of the lower pillar LP.

The core member 40 extends along the Z direction, and near a boundary surface B formed by an upper surface of the conductor layer 44 and a lower surface of the insulator layer 45, a diameter of a cross section along the XY plane continuously and largely changes. In an example of FIG. 4, in the core member 40, the diameter of an upper portion from nearby the boundary surface B is smaller than the diameter of a lower portion. A lower end of the core member 40 is located in a layer between the conductor layer 23 and the conductor layer 24. An upper end of the core member 40 is located in a layer higher than a layer provided with the conductor layer 24.

It should be noted that although the boundary surface B does not necessarily coincide with a boundary surface between the conductor layer 24 and the insulator layer formed above the conductor layer 24, at least a part of the conductor layer 24 is provided below the boundary surface B, and at least a part of the insulator layer provided above the conductor layer 24 is provided above the boundary surface B.

The semiconductor layer 41 covers a side surface and a bottom surface of the core member 40, and includes a portion provided in a cylindrical shape. A lower end of the semiconductor layer 41 is in contact with the semiconductor portion 33 in the lower pillar LP. An upper end of the semiconductor layer 41 is located above the upper end of the core member 40 and reaches the upper end of the upper pillar UP.

The semiconductor layer 42 covers a part of a side surface of the semiconductor layer 41 and includes a portion provided in a cylindrical shape. A lower end of the semiconductor layer 42 is located in a layer lower than a lower end of the conductor layer 24, and an upper end of the semiconductor layer 42 reaches the upper end of the upper pillar UP. It should be noted that the semiconductor layers 41 and 42 may not necessarily be identified as different layers.

The stacked film 43 covers a side surface of the semiconductor layer 42 and includes a portion provided in a cylindrical shape. The detailed layer structure of the stacked film 32 will be described later.

The semiconductor layer 41, the semiconductor layer 42, and the stacked film 43 are all provided continuously along the Z direction. That is, the semiconductor layer 41, the semiconductor layer 42, and the stacked film 43 are continuous films from a portion below the boundary surface B to a portion above the boundary surface B. Thicknesses of the semiconductor layer 41, the semiconductor layer 42, and the stacked film 43 along the XY plane are substantially uniform along the Z direction. Therefore, similarly to the diameter of the core member 40, in the semiconductor layer 41, the semiconductor layer 42, and the stacked film 43, the diameter of the cross section along the XY plane largely changes along the Z direction above and below the boundary surface B. In the example of FIG. 4, similar to the core member 40, in the semiconductor layer 41, the semiconductor layer 42, and the stacked film 43, the diameter above the boundary surface B may be significantly smaller than the diameter below the boundary surface B.

The conductor layer 44 covers a portion of a side surface of the stacked film 43 below the boundary surface B. The conductor layer 44 includes a portion provided in a cylindrical shape. For example, an upper end of the conductor layer 44 reaches the boundary surface B, and a lower end of the conductor layer 44 is located between the lower end of the conductor layer 24 and the lower end of the stacked film 43. The conductor layer 44 is electrically connected to the conductor layer 24. The conductor layer 44 includes, for example, polysilicon.

The insulator layer 45 covers a portion of the side surface of the stacked film 43 above the boundary surface B. The insulator layer 45 includes a portion provided in a cylindrical shape. For example, an upper end of the insulator layer 45 reaches the upper end of the upper pillar UP, and a lower end of the insulator layer 45 reaches the boundary surface B. For example, an inner diameter along the XY plane of the insulator layer 45 on the upper surface of the upper pillar UP is smaller than a diameter of the bottom surface of the upper pillar UP.

Near the boundary surface B, an outer diameter of the insulator layer 45 is substantially the same as an outer diameter of the conductor layer 44. On the other hand, near the boundary surface B, the inner diameter of the insulator layer 45 is smaller than an inner diameter of the conductor layer 44. Therefore, in the core member 40, the semiconductor layer 41, the semiconductor layer 42, and the stacked film 43 as described above, a rapid change in the size of the diameter of the cross section along the XY plane near the boundary surface B occurs.

The semiconductor portion 46 covers an upper surface of the core member 40 and is in contact with an inner wall of the portion of the semiconductor layer 41 provided above the core member 40. The semiconductor portion 46 is provided, for example, in a cylindrical shape, and reaches the upper end of the upper pillar UP.

The contact CP having a column shape is provided on upper surfaces of the semiconductor layer 41, the semiconductor layer 42, and the semiconductor portion 46 in the memory pillar MP. In the shown region, contacts CP corresponding to two among the four memory pillars MP are shown. The contact CP in a region not shown is connected to the memory pillar MP to which the contact CP is not connected in the corresponding region. One conductor layer 25, that is, one bit line BL is in contact with an upper surface of the contact CP. One contact CP is connected to one bit line BL in each of the spaces divided by the slits SLT and SHE.

The slit SLT is formed, for example, in a plate shape extended along the XZ plane, and divides the conductor layers 22 to 24. An upper end of the slit SLT is located in a layer between the conductor layer 24 and the conductor layer 25. A lower end of the slit SLT is located, for example, in a layer provided with the conductor layer 21. For example, the slit SLT includes an insulator such as silicon oxide.

The slit SHE is formed, for example, in a plate shape extended along the XZ plane, and divides the conductor layer 24. An upper end of the slit SHE is located in the layer between the conductor layer 24 and the conductor layer 25. A lower end of the slit SHE is located, for example, in a layer between a layer provided with the conductor layer 23 of the uppermost layer and a layer provided with the conductor layer 24. For example, the slit SHE includes an insulator such as silicon oxide.

The upper end of the slit SLT, the upper end of the slit SHE, and the upper end of the memory pillar MP may or may not be aligned. The lower end of the conductor layer and the lower end of the slit SHE may or may not be aligned.

Figure 5:
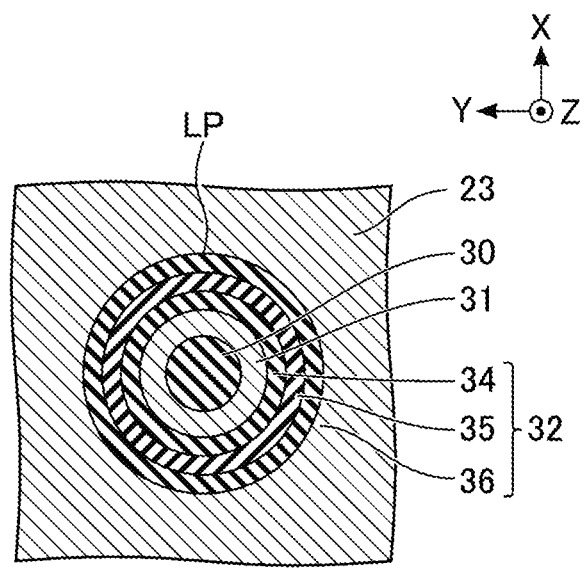
FIG. 5 is a cross-sectional view of an upper portion of a memory pillar along a line V-V of FIG. 4.

FIG. 5 is a cross-sectional view taken along a line V-V of FIG. 4 and shows an example of the cross-sectional structure of the memory pillar MP in the semiconductor storage device according to the first embodiment. More specifically, FIG. 5 shows a cross-sectional structure of the lower pillar LP in a layer parallel to the surface of semiconductor substrate 20 and including the conductor layer 23.

As shown in FIG. 5, in the layer including the conductor layer 23, for example, the core member 30 is provided in a central portion of the lower pillar LP. The semiconductor layer 31 surrounds the side surface of the core member 30. The stacked film 32 surrounds a side surface of the semiconductor layer 31. Specifically, the stacked film 32 includes, for example, a tunnel insulating film 34, an insulating film 35, and a block insulating film 36.

The tunnel insulating film 34 surrounds the side surface of the semiconductor layer 31. The insulating film 35 surrounds a side surface of the tunnel insulating film 34. The block insulating film 36 surrounds a side surface of the insulating film 35. The conductor layer 23 surrounds a side surface of the block insulating film 36. Each of the tunnel insulating film 34 and the block insulating film 36 includes, for example, silicon oxide. The insulating film 35 includes, for example, silicon nitride (SiN).

Figure 6:
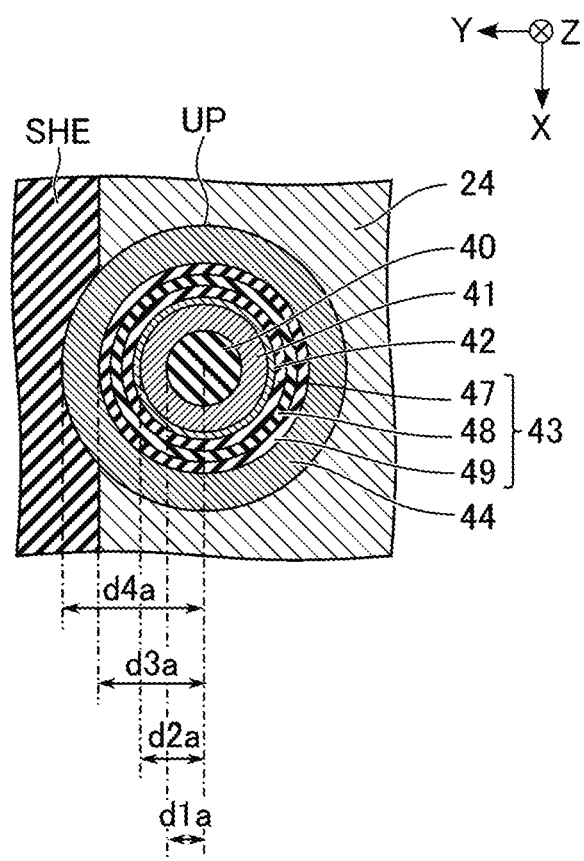
FIG. 6 is a cross-sectional view of the upper portion of the memory pillar along a line VI-VI of FIG. 4.

FIG. 6 is a cross-sectional view taken along a line VI-VI of FIG. 4 and shows an example of the cross-sectional structure of the memory pillar MP in the semiconductor storage device according to the first embodiment. More specifically, FIG. 6 shows a cross-sectional structure of the upper pillar UP parallel to the surface of the semiconductor substrate 20 and in the layer lower than the boundary surface B among the layers including the conductor layer 24. In a region shown in FIG. 6, the upper pillar UP and the slit SHE are in contact with each other.

As shown in FIG. 6, in the layer lower than the boundary surface B, for example, the core member 40 is provided at a central portion of the upper pillar UP and has an outer diameter d1a. The semiconductor layer 41 surrounds the side surface of the core member 40 and has an outer diameter d2a. The semiconductor layer 42 surrounds the side surface of the semiconductor layer 41. The stacked film 43 surrounds the side surface of the semiconductor layer 42 and has an outer diameter d3a. Specifically, the stacked film 43 includes, for example, a tunnel insulating film 47, an insulating film 48, and a block insulating film 49.

The tunnel insulating film 47 surrounds the side surface of the semiconductor layer 42. The insulating film 48 surrounds a side surface of the tunnel insulating film 47. The block insulating film 49 surrounds a side surface of the insulating film 48. Each of the tunnel insulating film 47 and the block insulating film 49 includes, for example, silicon oxide. The insulating film 48 includes, for example, silicon nitride (SiN).

The conductor layer 44 surrounds a side surface of the block insulating film 49 and has an outer diameter d4a. A side surface of the conductor layer 44 is in contact with, for example, each of the conductor layer 24 and the slit SHE.

Figure 7:
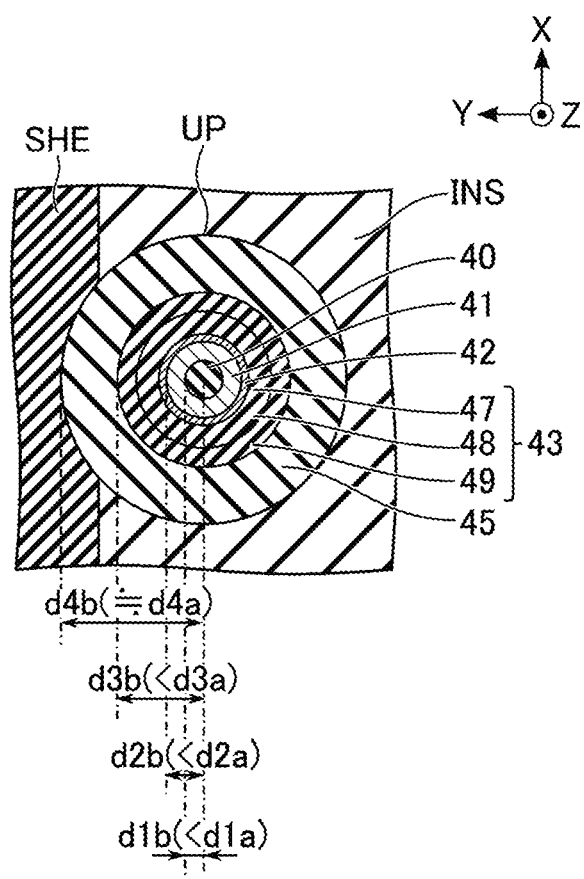
FIG. 7 is a cross-sectional view of the upper portion of the memory pillar along a line VII-VII of FIG. 4.

FIG. 7 is a cross-sectional view taken along a line VII-VII of FIG. 4 and shows an example of the cross-sectional structure of the memory pillar MP in the semiconductor storage device according to the first embodiment. More specifically, FIG. 7 shows the cross-sectional structure of the upper pillar UP in a layer parallel to the surface of the semiconductor substrate 20 and including the insulator layer INS provided above the conductor layer 24 among the layers higher than the boundary surface B. In a region shown in FIG. 7, the upper pillar UP and the slit SHE are in contact with each other.

As shown in FIG. 7, in the layer higher than the boundary surface B, for example, the core member 40 is provided at the central portion of the upper pillar UP and has an outer diameter d1b smaller than the outer diameter d1a. The semiconductor layer 41 surrounds the side surface of the core member 40 and has an outer diameter d2b smaller than the outer diameter d2a. The semiconductor layer 42 surrounds the side surface of the semiconductor layer 41. The stacked film 43 surrounds the side surface of the semiconductor layer 42 and has an outer diameter d3b smaller than the outer diameter d3a. The insulator layer 45 surrounds the side surface of the stacked film 43 (block insulating film 49) and has an outer diameter d4b. The outer diameter d4b may be regarded as substantially the same as the outer diameter d4a by disregarding a change amount of the outer diameter of the upper pillar UP along the Z direction due to the tapered shape. A side surface of the insulator layer 45 is in contact with, for example, each of the insulator layer INS and the slit SHE.

In the structure of the memory pillar MP described above, a portion where the memory pillar MP and the conductor layer 22 intersect with each other functions as the select transistor ST2. A portion where the memory pillar MP and the conductor layer 23 intersect with each other functions as the memory cell transistor MT. A portion where the memory pillar MP and the conductor layer 24 intersect with each other functions as the select transistor ST1.

That is, the semiconductor layer 31 is used as a channel of each of the memory cell transistor MT and the select transistor ST2. The insulating film 35 is used as a charge storage layer of the memory cell transistor MT and the select transistor ST2. The semiconductor layer 41 is used as a channel of the select transistor ST1. The insulating film 48 is used as a charge storage layer of the select transistor ST1. Therefore, each of the memory pillars MP functions as, for example, one NAND string NS.

It should be noted that the structure of the memory cell array 10 described above is merely an example, and the memory cell array 10 may have other structures. For example, the number of conductor layers 23 is designed based on the number of word lines WL. A plurality of conductor layers 22 provided in a plurality of layers may be allocated to the select gate line SGS. If the select gate line SGS is provided in the plurality of layers, a conductor different from the conductor layer 22 may be used. The memory pillar MP and the conductor layer 25 may be electrically connected through two or more contacts, or may be electrically connected through other wires. The inside of the slit SLT may be configured with plural types of insulators.

1.2 Method Of Manufacturing Semiconductor Storage Device

Hereinafter, an example of a series of manufacturing processes from formation of a stacked structure corresponding to the word line WL to formation of the select gate line SGD in the semiconductor storage device according to the first embodiment will be described. Each of FIGS. 8 to 26 shows an example of a cross-sectional structure including a structure corresponding to the memory cell array in the manufacturing process of the semiconductor storage device according to the first embodiment. It should be noted that a cross-sectional view of the manufacturing process referred to below includes a cross section parallel to the surface of the semiconductor substrate 20 and a cross section perpendicular to the surface of the semiconductor substrate 20. A region displayed in the cross-sectional view of each manufacturing process includes a region in which two memory pillars MP and each of the slits SLT and SHE are formed.

Figure 8:
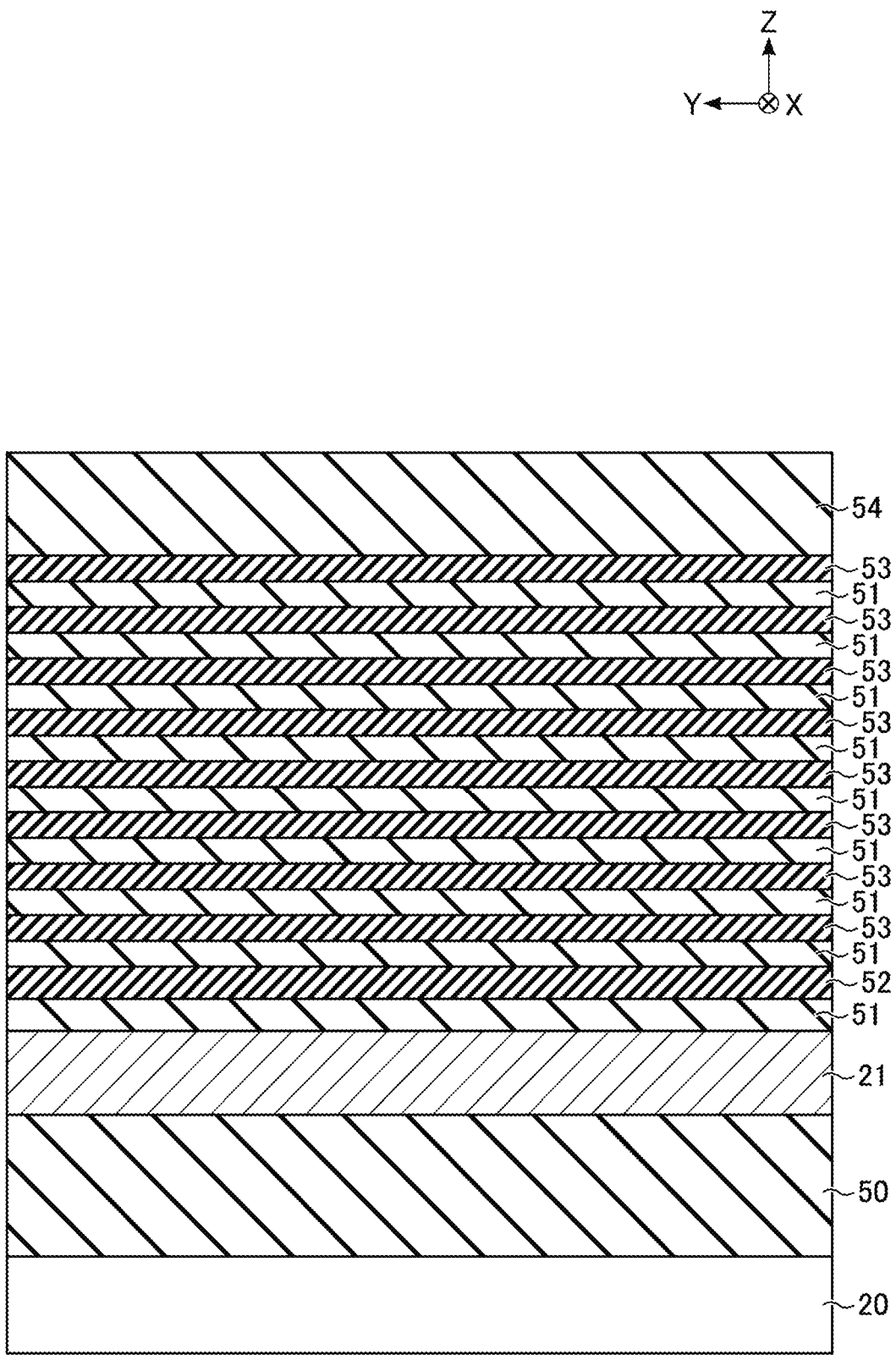
FIG. 8 is a cross-sectional view of the memory cell array illustrating a manufacturing process of the semiconductor storage device of the first embodiment.

First, as shown in FIG. 8, a sacrificial material 52 corresponding to the select gate line SGS and a sacrificial material 53 corresponding to the word line WL are stacked. Specifically, first, the insulator layer 50 and the conductor layer 21 are sequentially stacked on the semiconductor substrate 20. Although not shown, in the insulator layer 50, for example, peripheral circuits such as the sense amplifier module 16 are formed. Thereafter, the insulator layer 51 and the sacrificial material 52 are stacked on the conductor layer 21, and the insulator layer 51 and the sacrificial material 53 are alternately stacked on the sacrificial material 52 a plurality of number of times. The insulator layer 54 is stacked on the sacrificial material 53 of the uppermost layer.

The conductor layer 21 is used as the source line SL. The conductor layer 21 includes, for example, silicon (Si). Each of the insulator layers 51 and 54 includes, for example, silicon oxide ($SiO_2$). For example, the number of layers in which the sacrificial material 52 is formed corresponds to the number of select gate lines SGS to be stacked, and the number of layers in which the sacrificial material 53 is formed corresponds to the number of word lines WL to be stacked. The sacrificial materials 52 and 53 include, for example, silicon nitride (SiN).

Figure 9:
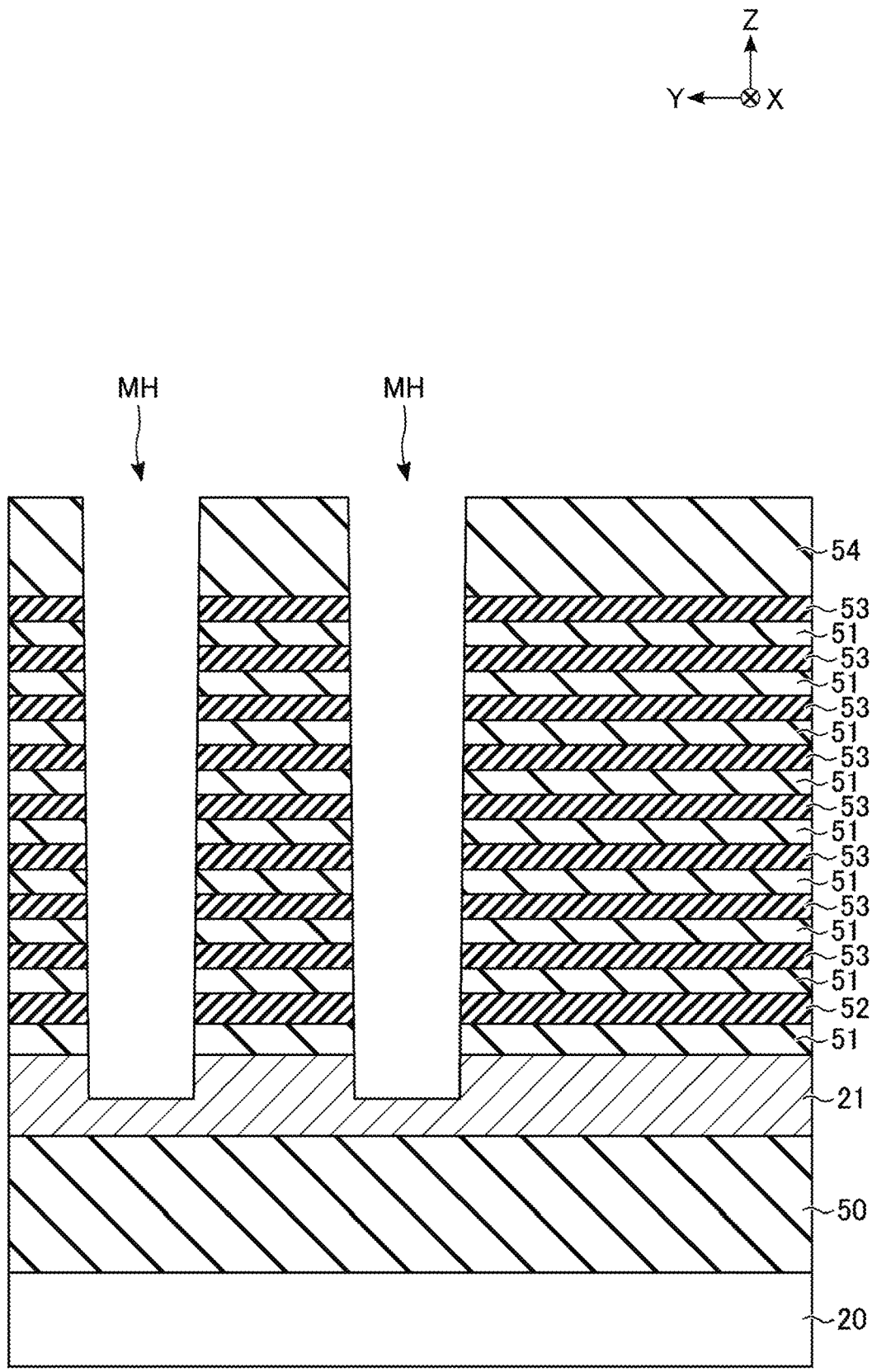
FIG. 9 is a cross-sectional view of the memory cell array illustrating the manufacturing process of the semiconductor storage device of the first embodiment.

Next, as shown in FIG. 9, the memory hole MH corresponding to the lower pillar LP is formed. Specifically, first, a mask including an opening in a region corresponding to the memory hole MH is formed by photolithography or the like. The memory hole MH is formed by anisotropic etching using the formed mask. The plurality of memory holes MH are arranged in a zigzag shape in the plan view (not shown).

The memory hole MH formed in the present process penetrates each of the insulator layer 51, the sacrificial materials 52 and 53, and the insulator layer 54, and a bottom portion of the memory hole MH stops in, for example, the conductor layer 21. The anisotropic etching in the present process is, for example, reactive ion etching (RIE).

Figure 10:
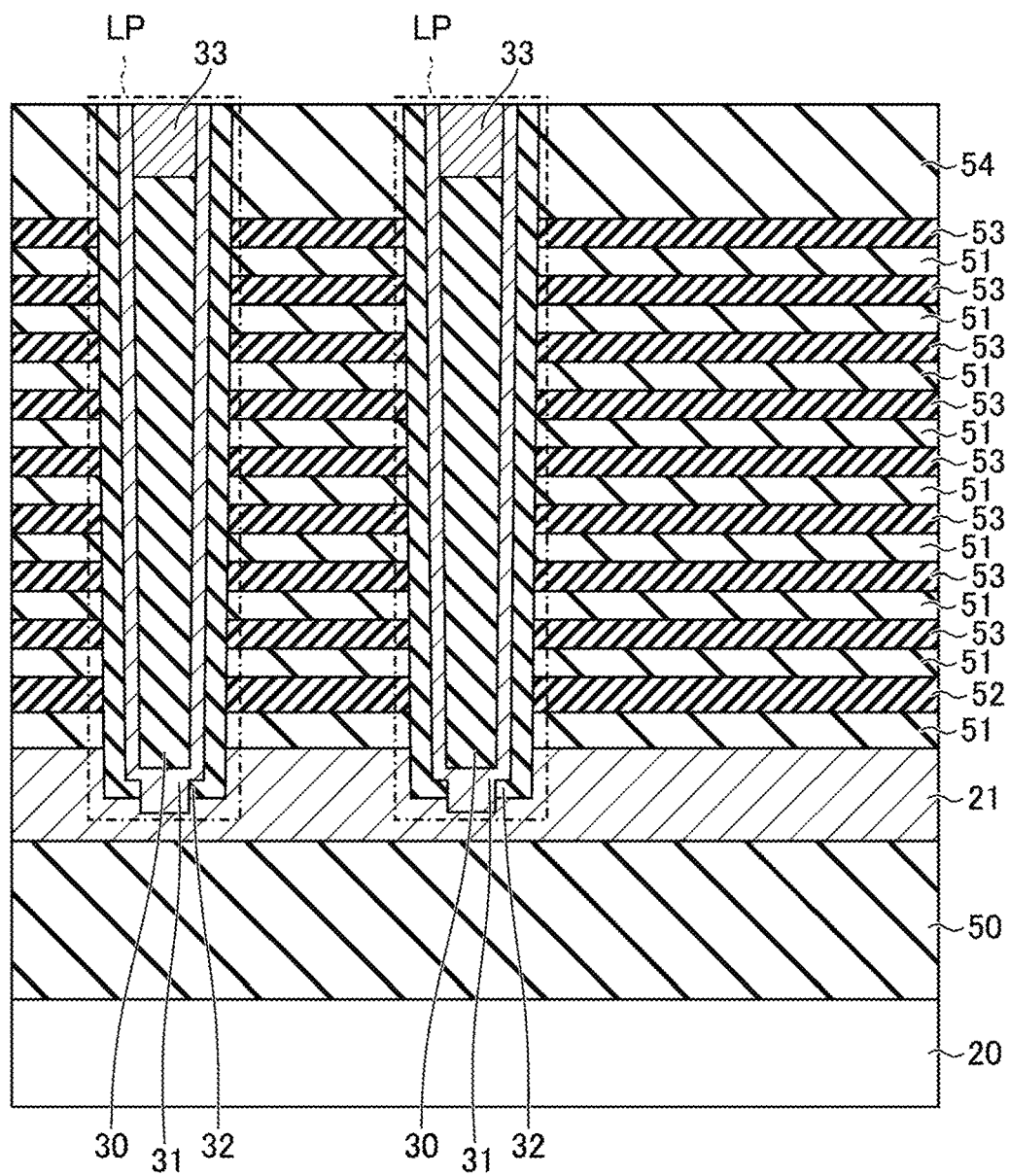
FIG. 10 is a cross-sectional view of the memory cell array illustrating the manufacturing process of the semiconductor storage device of the first embodiment.

Next, as shown in FIG. 10, a stacked structure in the memory hole MH, that is, the lower pillar LP is formed. Specifically, the stacked film 32 is formed on a side surface and a bottom surface of the memory hole MH and an upper surface of the insulator layer 54. That is, the block insulating film 36, the insulating film 35, and the tunnel insulating film 34 are sequentially formed.

After the stacked film 32 of the bottom portion of the memory hole MH is removed, the semiconductor layer 31 and the core member 30 are sequentially formed, and an inside of the memory hole MH is buried by the core member 30. A part of the core member 30 formed above the memory hole MH is removed, and the semiconductor portion 33 is buried in the space. Thereafter, the stacked film 32, the semiconductor layer 31, and the semiconductor portion 33 remaining in a layer higher than the insulator layer 54 are removed. Therefore, the lower pillar LP is formed.

Figure 11:
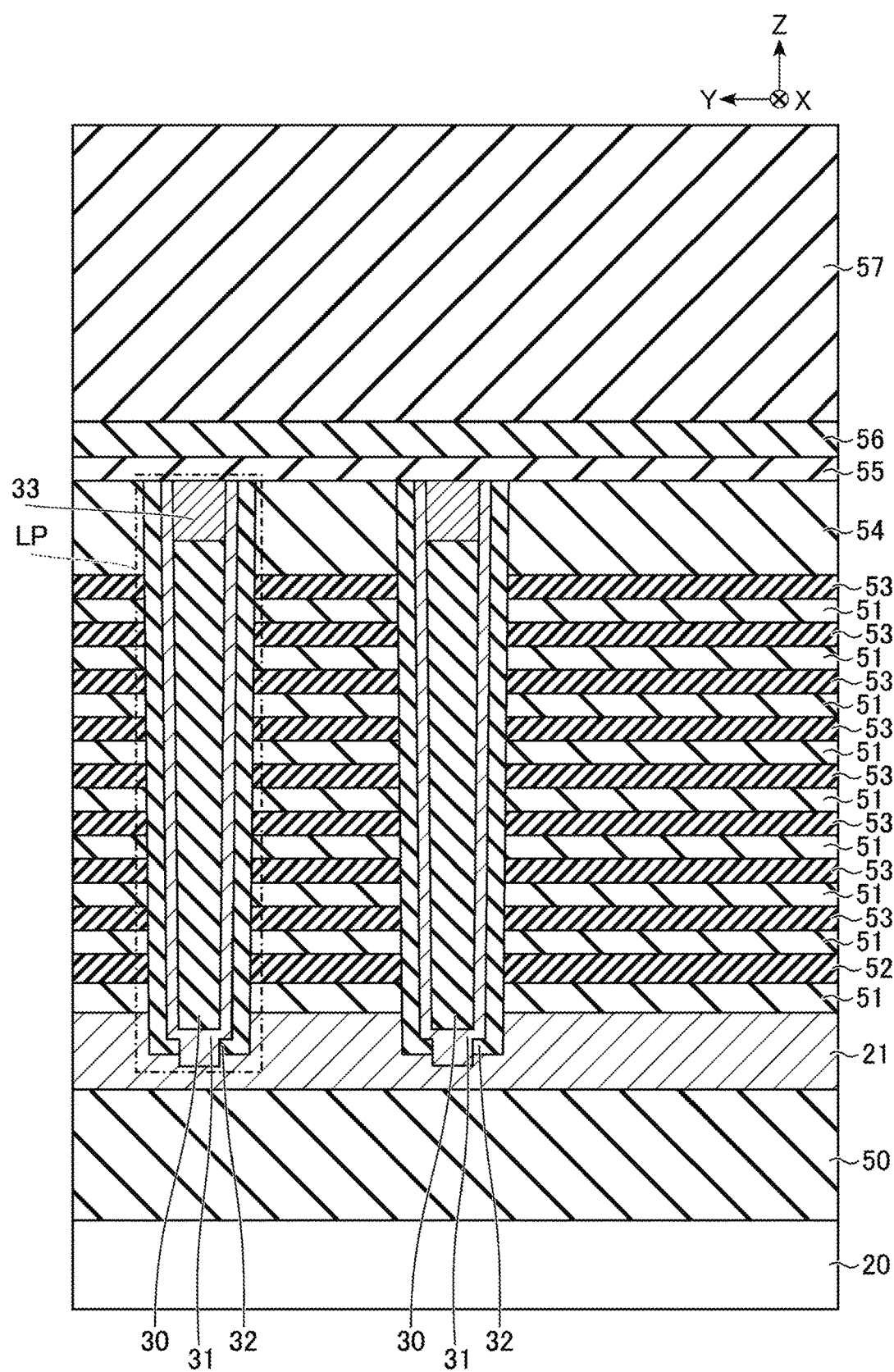
FIG. 11 is a cross-sectional view of the memory cell array illustrating the manufacturing process of the semiconductor storage device of the first embodiment.

Next, as shown in FIG. 11, the insulator layer 55, an etching stop layer 56, and a sacrificial material 57 corresponding to the select gate line SGD are stacked on the upper surfaces of the lower pillar LP and the insulator layer 54. The insulator layer 55 includes, for example, silicon oxide ($SiO_2$). The etching stop layer 56 includes, for example, aluminum oxide (AlO). The sacrificial material is formed of, for example, the same material as the sacrificial materials 52 and 53, and includes silicon nitride (SiN).

Figure 12:
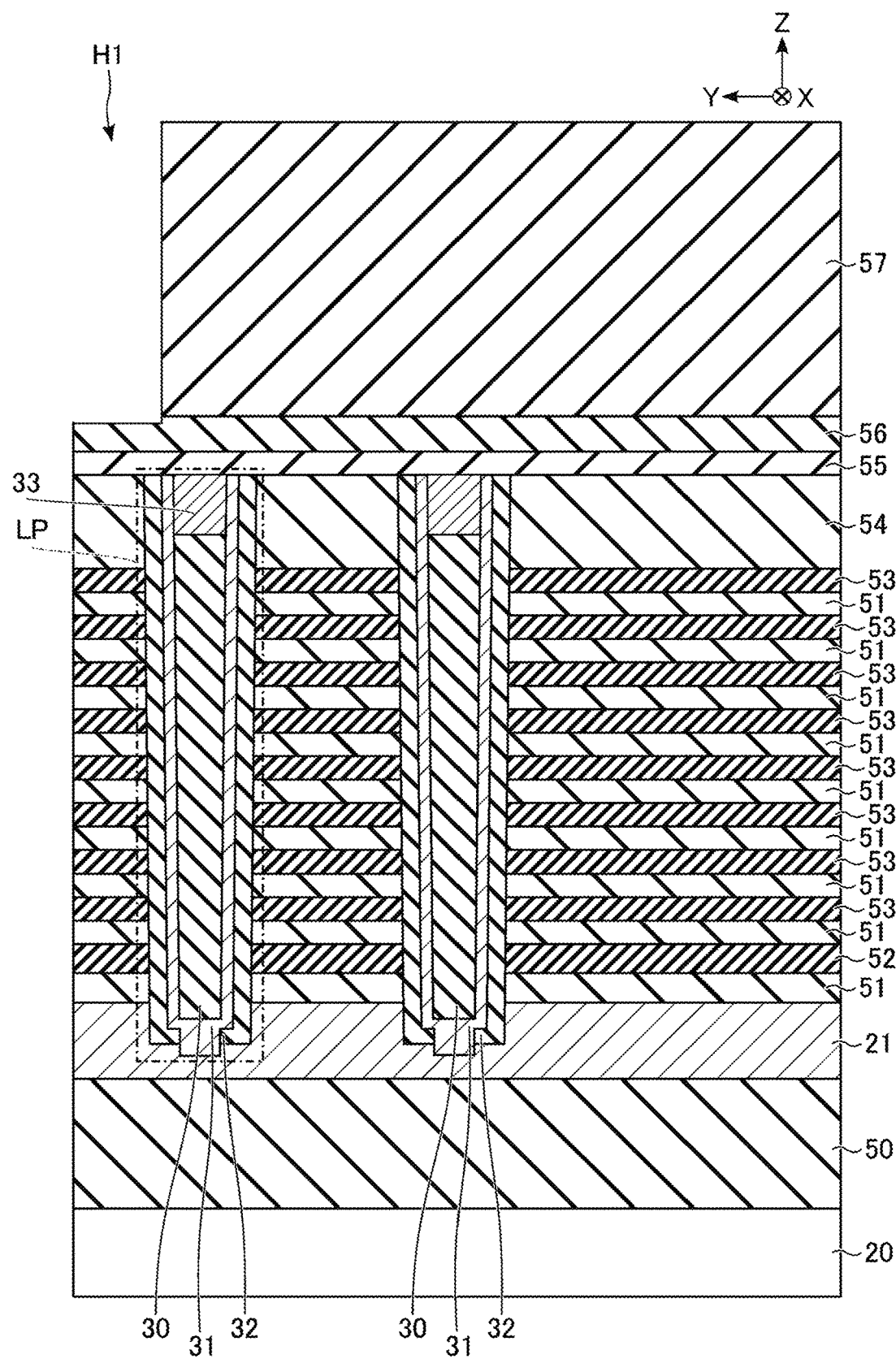
FIG. 12 is a cross-sectional view of the memory cell array illustrating the manufacturing process of the semiconductor storage device of the first embodiment.

Next, as shown in FIG. 12, a hole H1 corresponding to the slit SHE is formed. Specifically, first, a mask including an opening in a region corresponding to the slit SHE is formed by photolithography or the like. The hole H1 is formed by anisotropic etching using the formed mask. In the plan view, the hole H1 is provided with a portion overlapping the lower pillars LP arranged in a zigzag shape.

The hole H1 formed in the present process divides the sacrificial material 57, and a bottom portion of the hole H1 stops in, for example, the etching stop layer 56. The hole H1 divides at least the sacrificial material 57 preferably. The anisotropic etching in the present process is, for example, RIE.

Figure 13:
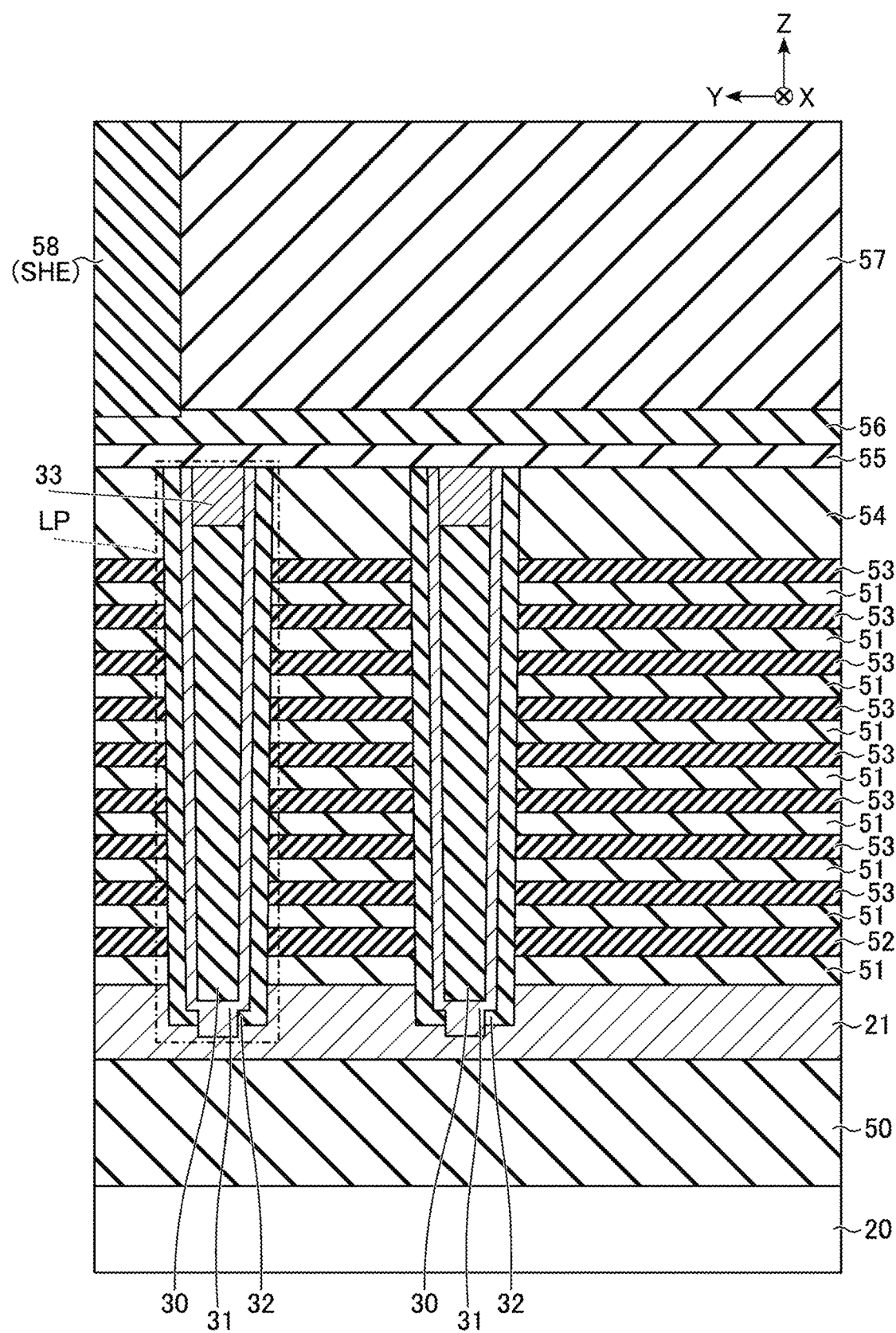
FIG. 13 is a cross-sectional view of the memory cell array illustrating the manufacturing process of the semiconductor storage device of the first embodiment.

Next, as shown in FIG. 13, an insulator layer 58 corresponding to the slit SHE is formed on the sacrificial material 57 so that the hole H1 is buried. The insulator layer 58 formed in a layer higher than the sacrificial material 57 is removed by, for example, etch back process. The insulator layer 58 includes, for example, silicon oxide ($SiO_2$).

Figure 14:
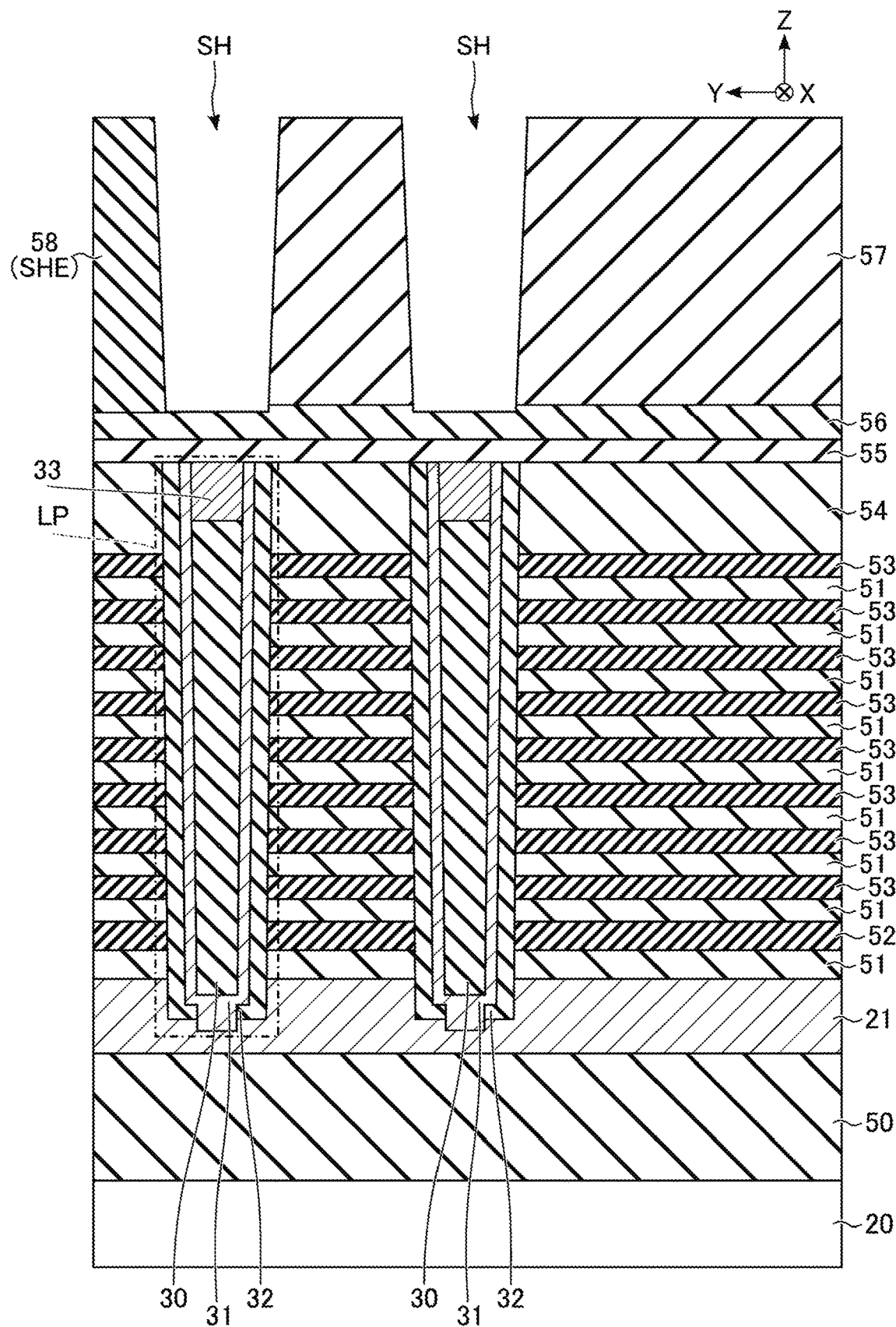
FIG. 14 is a cross-sectional view of the memory cell array illustrating the manufacturing process of the semiconductor storage device of the first embodiment.

Next, as shown in FIG. 14, an SGD hole SH corresponding to the upper pillar UP is formed. Specifically, first, a mask including an opening in a region corresponding to the SGD hole SH is formed by photolithography or the like. The SGD hole SH is formed by anisotropic etching using the formed mask. A plurality of SGD holes SH respectively overlap the plurality of lower pillars LP in a plan view (not shown). The plurality of SGD holes SH includes the SGD holes SH overlapping the insulator layer 58. That is, the plurality of SGD holes SH includes the SGD holes SH in which the insulator layer 58 is exposed on a side wall.

The SGD hole SH formed in the present process penetrates the sacrificial material 57, and a bottom portion of the SGD hole SH stops in, for example, the etching stop layer 56. The bottom portion of the SGD hole SH may or may not be aligned with a bottom portion of the insulating layer 58. The anisotropic etching in the present process is, for example, RIE.

Next, as shown in FIGS. 15 to 21, a stacked structure in the SGD hole SH is formed.

Figure 15:
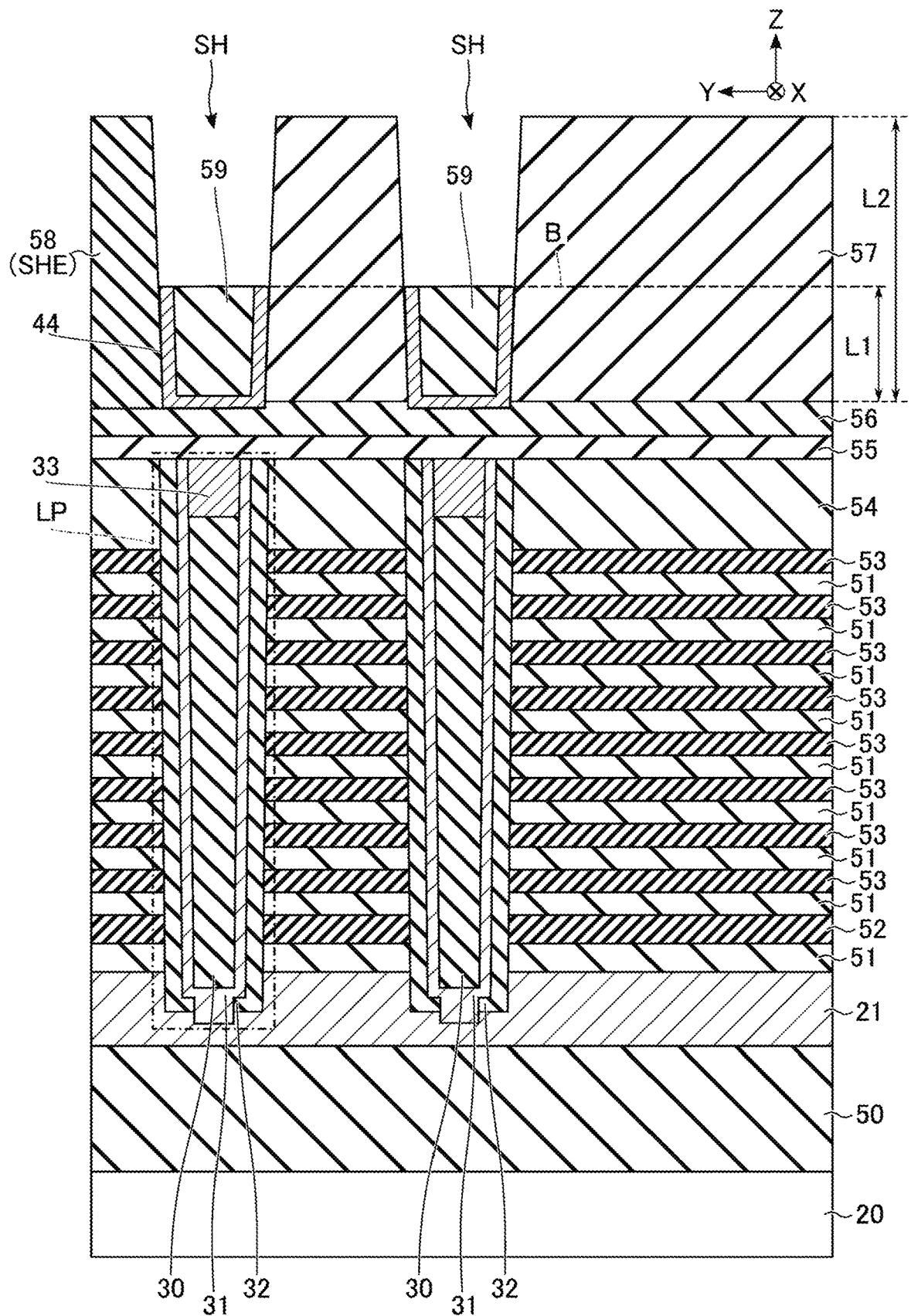
FIG. 15 is a cross-sectional view of the memory cell array illustrating the manufacturing process of the semiconductor storage device of the first embodiment.

Specifically, first, as shown in FIG. 15, a stacked structure is formed to a desired height L1 from a bottom portion of the SGD hole SH. The height L1 is smaller than a height L2 from the bottom portion of the SGD hole SH to the opening (L1<L2). More specifically, the conductor layer 44 and a sacrificial material 59 are stacked in this sequence on the sacrificial material 57 and the insulator layer 58, and the sacrificial material 59 is removed to a predetermined depth (L1–L2) in the SGD hole SH by, for example, the etch back process. Thereafter, the conductor layer 44 is removed by additional etch back process to the height L1 of the sacrificial material 59 remaining in the SGD hole SH. Upper surfaces of the conductor layer 44 and the sacrificial material 59 correspond to the boundary surface B. The sacrificial material 59 includes, for example, spin on glass (SOG).

Figure 16:
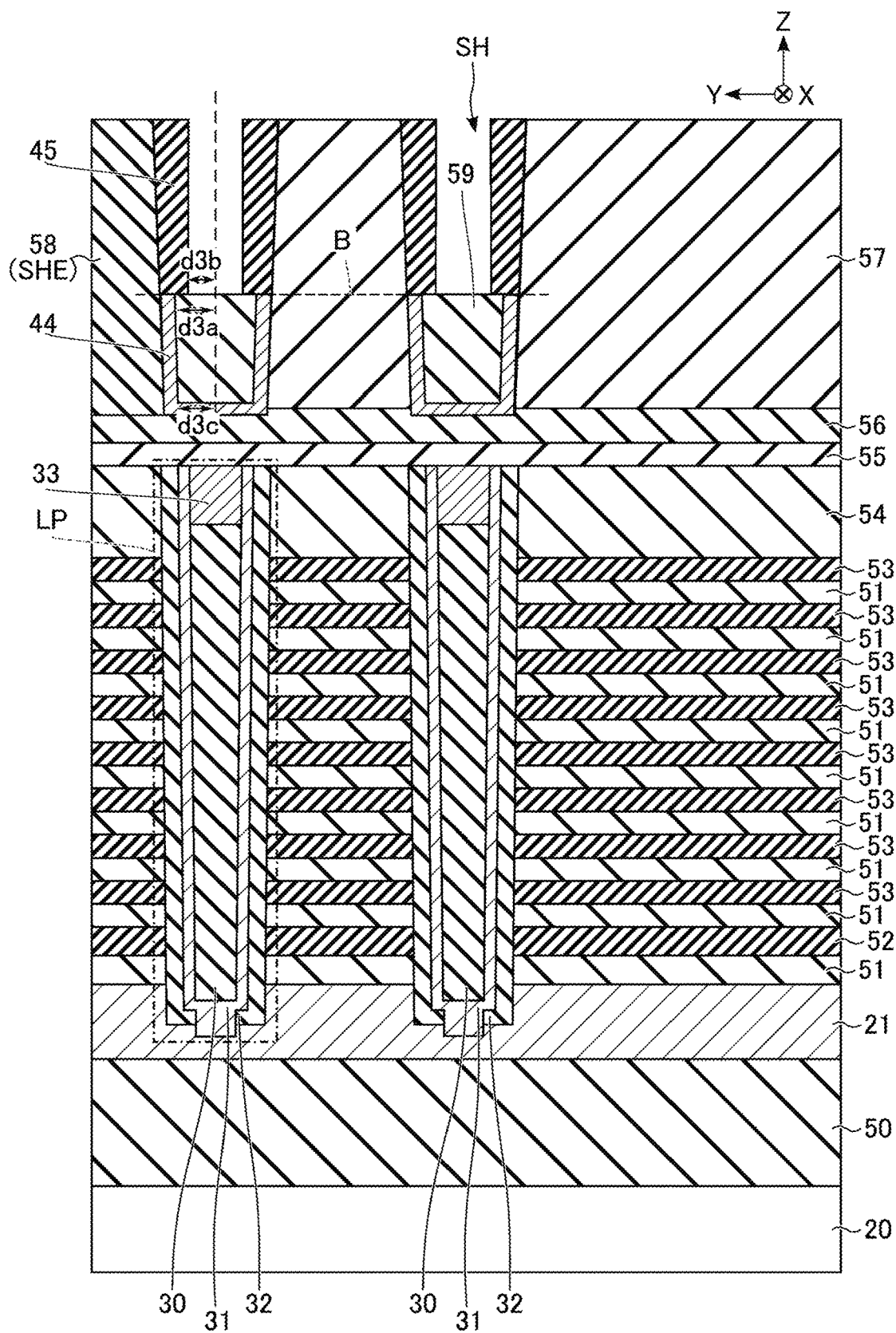
FIG. 16 is a cross-sectional view of the memory cell array illustrating the manufacturing process of the semiconductor storage device of the first embodiment.

As shown in FIG. 16, the insulator layer 45 is formed on an inner wall of a remaining portion (that is, a portion above the boundary surface B) of the SGD hole SH. Here, the insulator layer 45 is formed to be thicker than the conductor layer 44. Therefore, the inner diameter (=d3b) of the insulator layer 45 in the vicinity of the boundary surface B is smaller than the inner diameter (=d3a) of the conductor layer 44. The inner diameter of the insulator layer 45 in the vicinity of the boundary surface B is smaller than the diameter (=d3c) of the bottom surface of the SGD hole SH.

Figure 17:
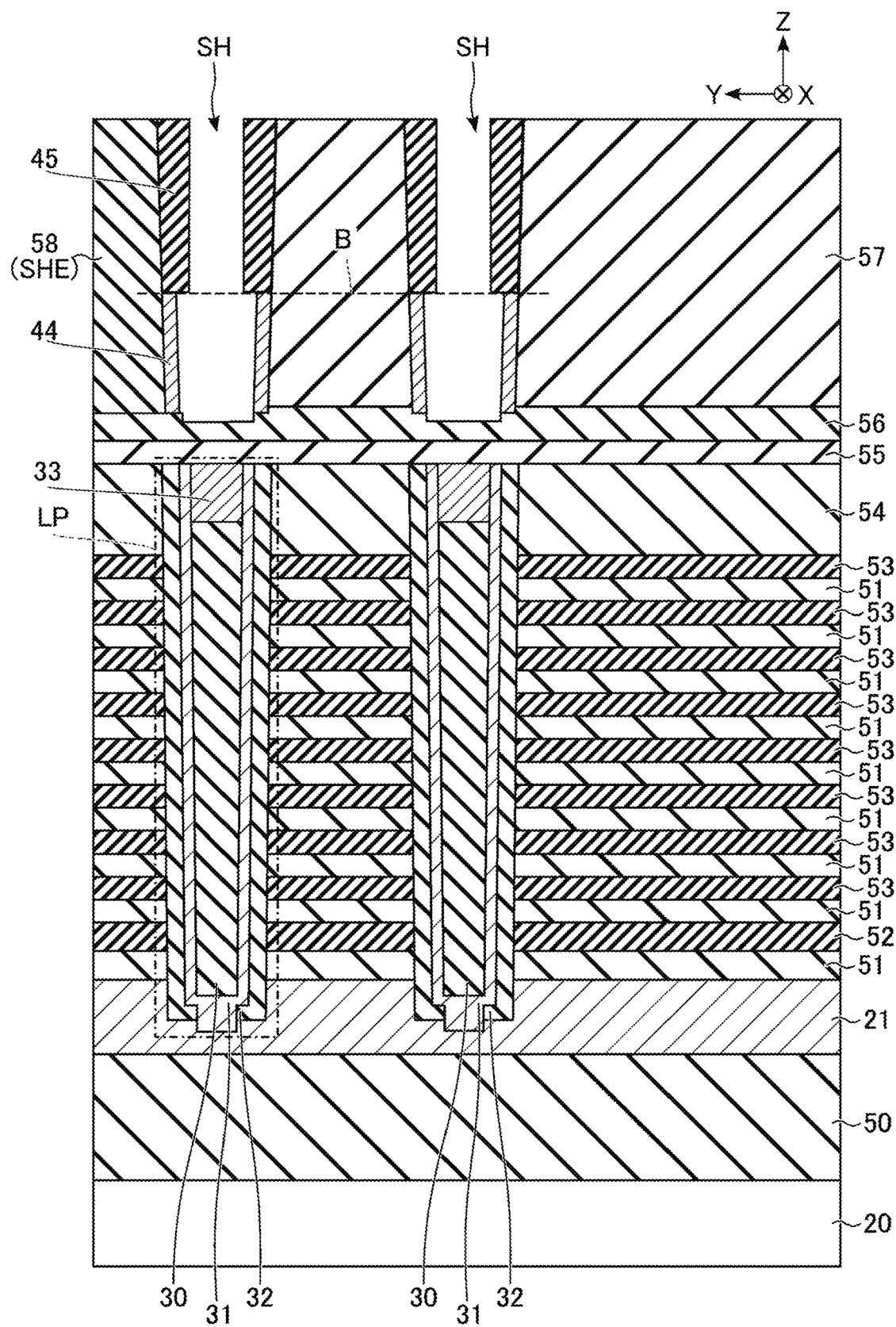
FIG. 17 is a cross-sectional view of the memory cell array illustrating the manufacturing process of the semiconductor storage device of the first embodiment.

As shown in FIG. 17, after the sacrificial material 59 is removed by the etch back process, the conductor layer 44 of the bottom portion of the SGD hole SH is removed by anisotropic etching. Therefore, an upper surface of the etching stop layer 56 is exposed at the bottom portion of each SGD hole SH. The anisotropic etching in the present process is, for example, RIE. As described above, a diameter of the opening in the SGD hole SH is smaller than a diameter of the bottom surface of the SGD hole SH. Therefore, the thick insulator layer 45 serves as a mask for a component (ion species) of etching gas that is entering in an anisotropic manner, and the incidence of the component of the etching gas is prevented regarding the conductor layer 44 formed on a side wall of the SGD hole SH, and thinning of the conductor layer 44 is prevented. On the other hand, the component of the etching gas that is entering in an anisotropic manner is sufficiently supplied to the bottom surface of the SGD hole SH without decreasing. As described above, according to the present embodiment, it is possible to selectively etch the conductor layer 44 of the bottom portion while preventing the etching of the conductor layer 44 on the side wall of the SGD hole SH.

Figure 18:
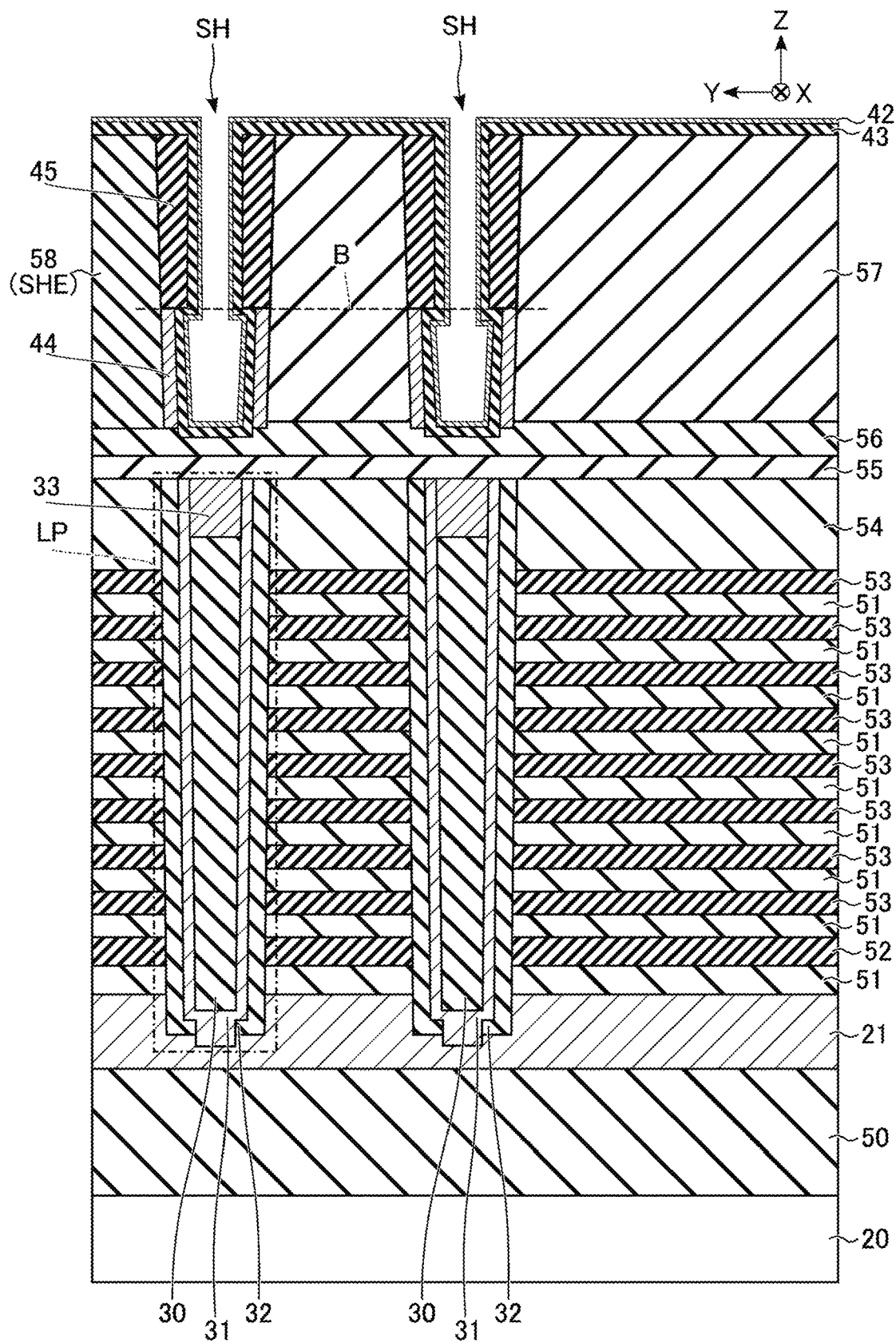
FIG. 18 is a cross-sectional view of the memory cell array illustrating the manufacturing process of the semiconductor storage device of the first embodiment.

Thereafter, as shown in FIG. 18, the stacked film 43 and the semiconductor layer 42 are sequentially formed on the sacrificial material 57 and the insulator layer 58, and in the SGD hole SH. The inner diameter of the SGD hole SH of a portion of the formed stacked film 43 and semiconductor layer 42 changes along the Z direction near the boundary surface B between the conductor layer 44 and the insulator layer 45. That is, the inner diameter of the portion of the stacked film 43 along the conductor layer 44 is larger than the inner diameter of the portion along the insulator layer 45.

Figure 19:
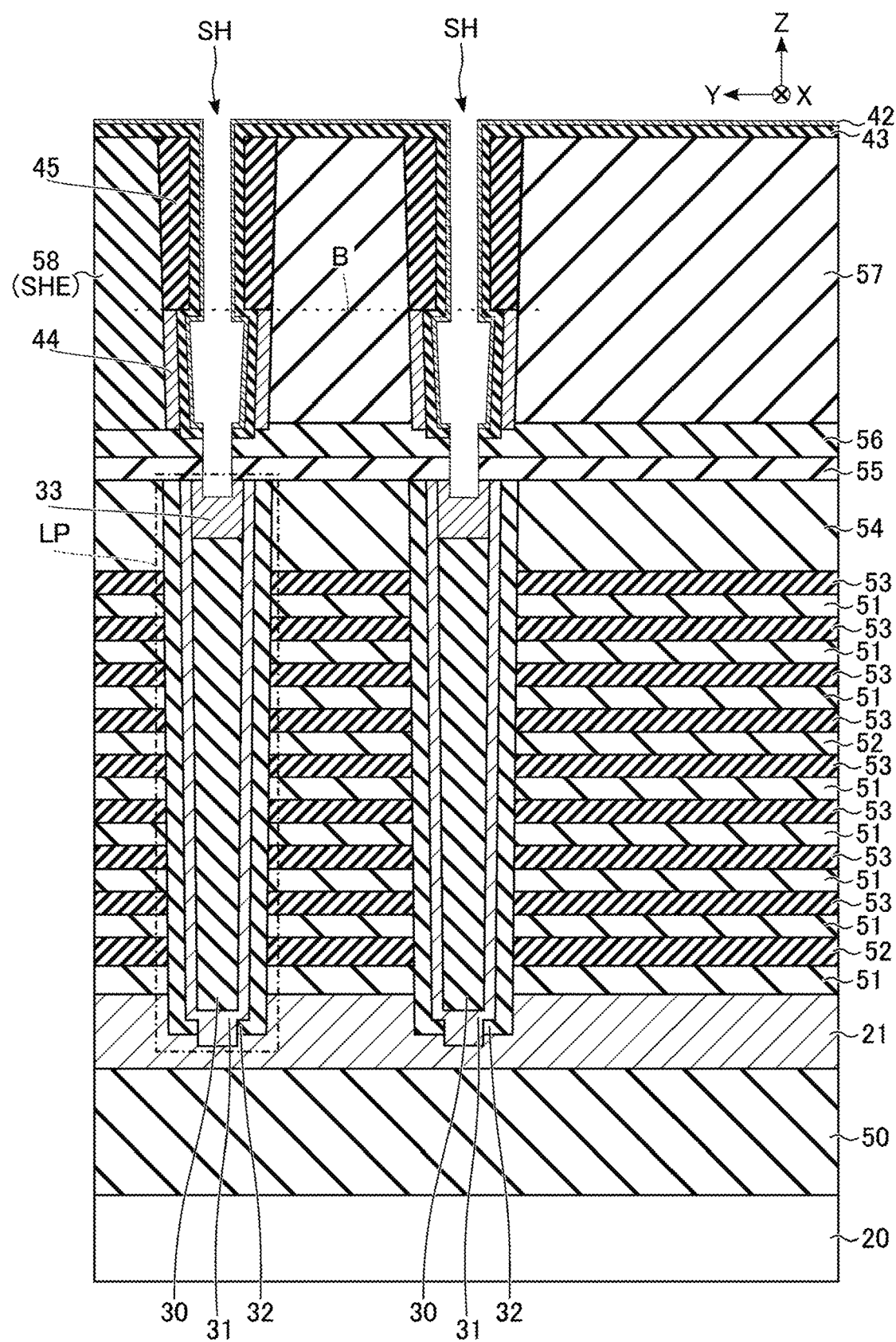
FIG. 19 is a cross-sectional view of the memory cell array illustrating the manufacturing process of the semiconductor storage device of the first embodiment.

As shown in FIG. 19, the semiconductor layer 42 and the stacked film 43 of the bottom portion of the SGD hole SH are removed by anisotropic etching. The SGD hole SH formed in the present process penetrates the etching stop layer 56 and the insulator layer 55, and the bottom portion of the SGD hole SH stops in, for example, the semiconductor portion 33 of the lower pillar LP. The anisotropic etching in the present process is, for example, RIE.

Figure 20:
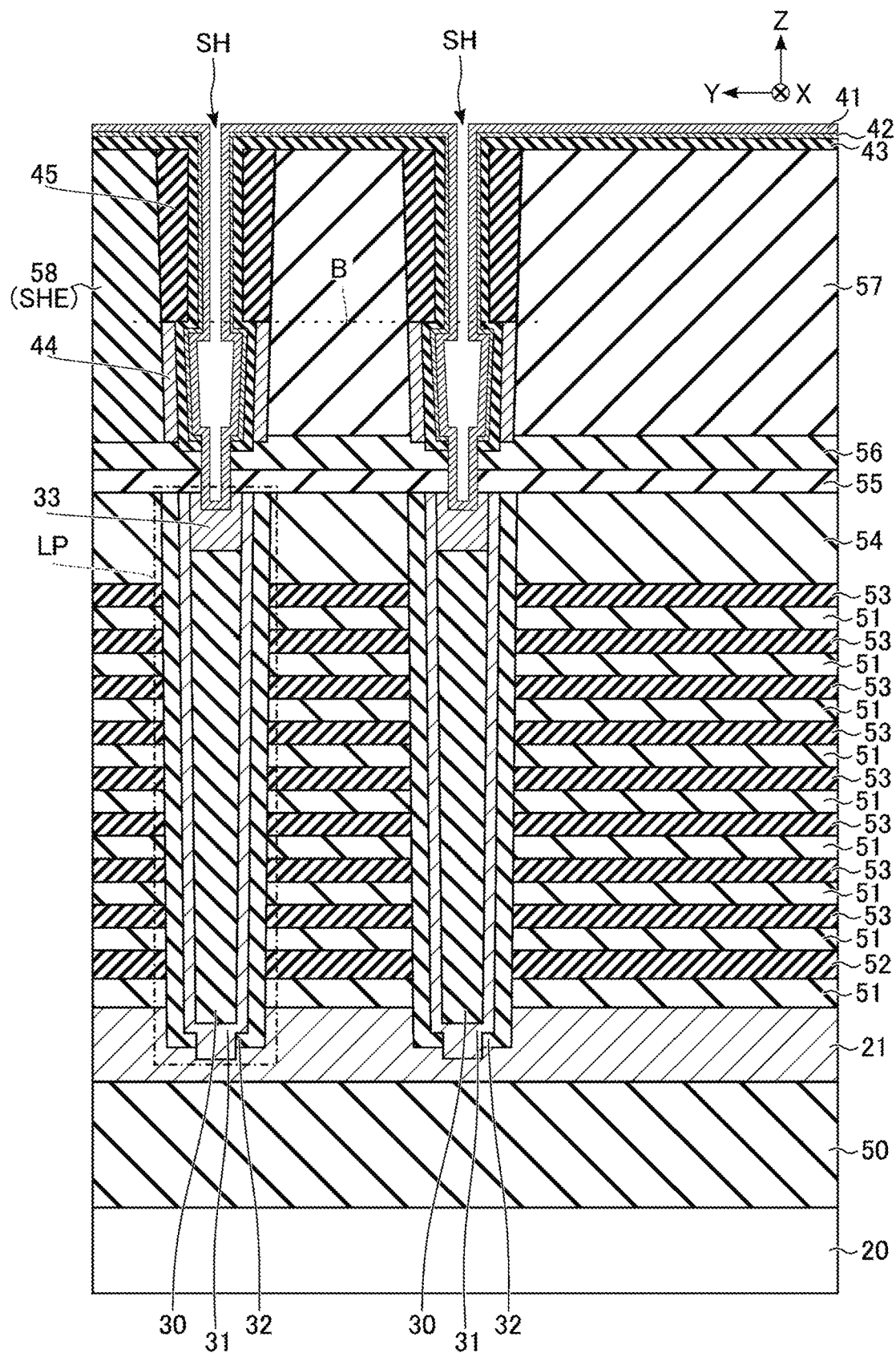
FIG. 20 is a cross-sectional view of the memory cell array illustrating the manufacturing process of the semiconductor storage device of the first embodiment.
Figure 21:
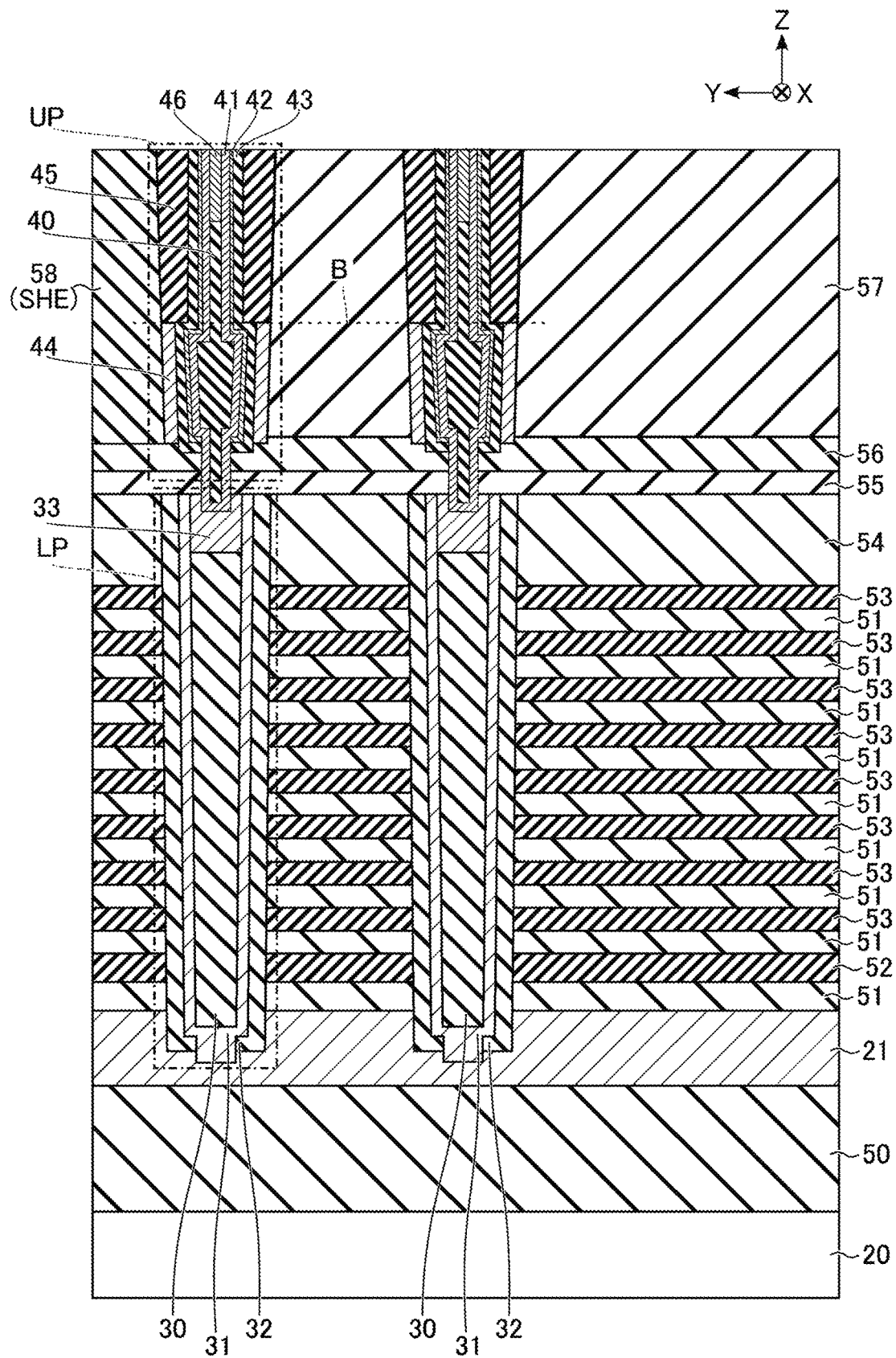
FIG. 21 is a cross-sectional view of the memory cell array illustrating the manufacturing process of the semiconductor storage device of the first embodiment.

As shown in FIGS. 20 and 21, the semiconductor layer 41 and the core member 40 are sequentially formed on the sacrificial material 57 and the insulator layer 58, and in the SGD hole SH. In the semiconductor layer 41, the diameter of the portion between the core member 40 and the conductor layer 44 is larger than the diameter of the portion between the core member 40 and the insulator layer 45. Thereafter, a part of the core member 40 formed above the SGD hole SH is removed, the semiconductor portion 46 is buried in the corresponding space. The stacked film 43, the semiconductor layer 42, the semiconductor layer 41, the core member 40, and the semiconductor portion 46 remaining in the layer higher than the sacrificial material 57 and the insulator layer 58 are removed, for example, by CMP. Therefore, the upper pillar UP is formed in the SGD hole SH.

Figure 22:
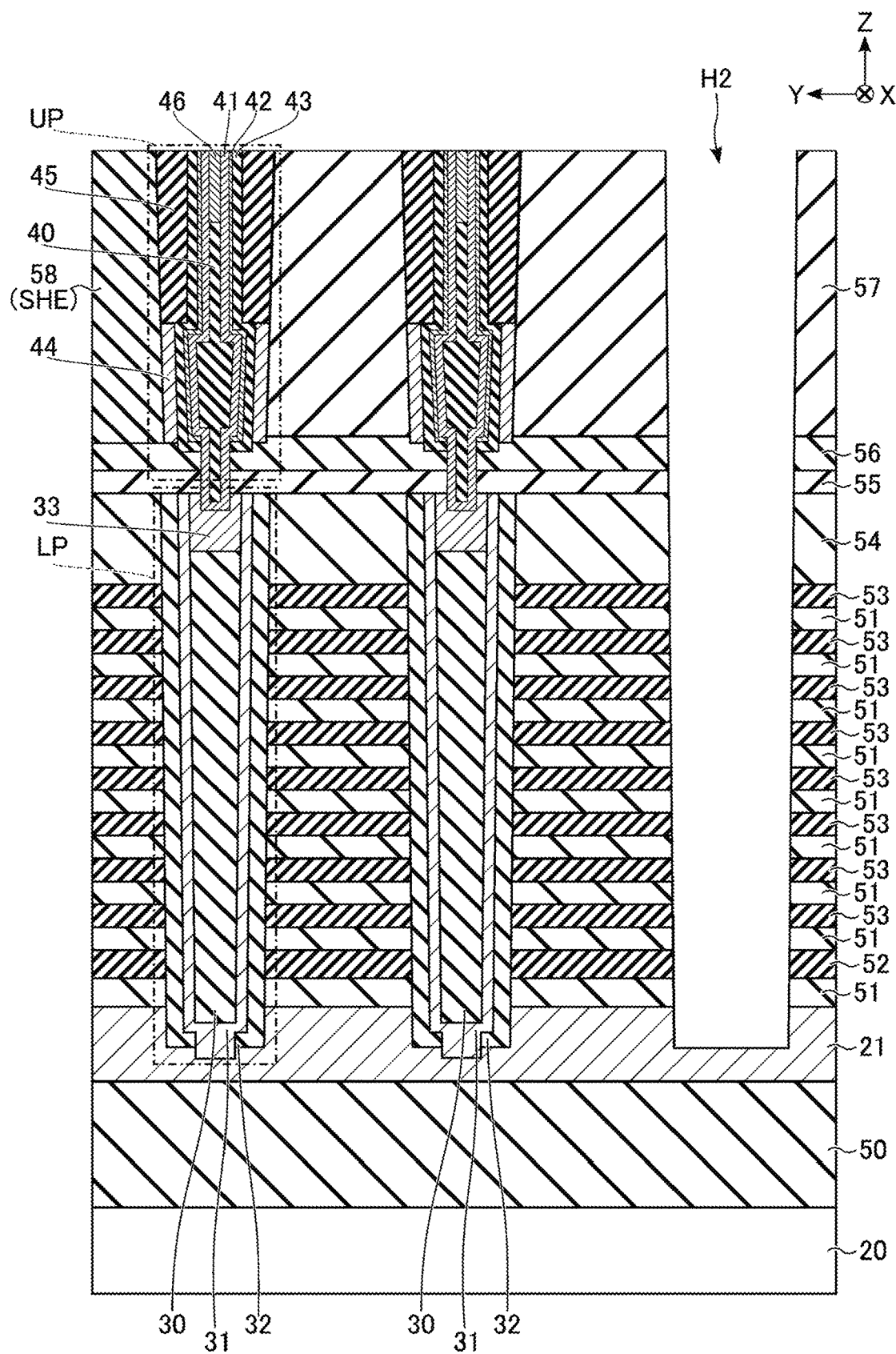
FIG. 22 is a cross-sectional view of the memory cell array illustrating the manufacturing process of the semiconductor storage device of the first embodiment.

Next, as shown in FIG. 22, a hole H2 corresponding to the slit SLT is formed. Specifically, first, a mask including an opening in a region corresponding to the hole H2 is formed by photolithography or the like. The hole H2 is formed by anisotropic etching using the formed mask.

The hole H2 formed in the present process divides each of the insulator layer 51, the sacrificial materials 52 and 53, the insulator layers 54 and 55, the etching stop layer 56, and the sacrificial material 57, and a bottom portion of the hole H2 stops in, for example, a layer provided with the conductor layer 21. It should be noted that the bottom portion of the hole H2 may reach at least the layer in which the conductor layer 21 is formed. The anisotropic etching in the present process is, for example, RIE.

Next, a replacement process of the sacrificial materials 52 and 53 with the word line WL and the select gate line SGS is executed. Specifically, first, a surface of the conductor layer 21 exposed in the hole H2 is oxidized to form an oxidation protective film (not shown). Thereafter, the sacrificial materials 52 and 53 are selectively removed, for example, by wet etching using hot phosphoric acid. A three-dimensional structure of a structure from which the sacrificial materials 52 and 53 are removed is maintained by a plurality of memory pillars MP and the like.

Figure 23:
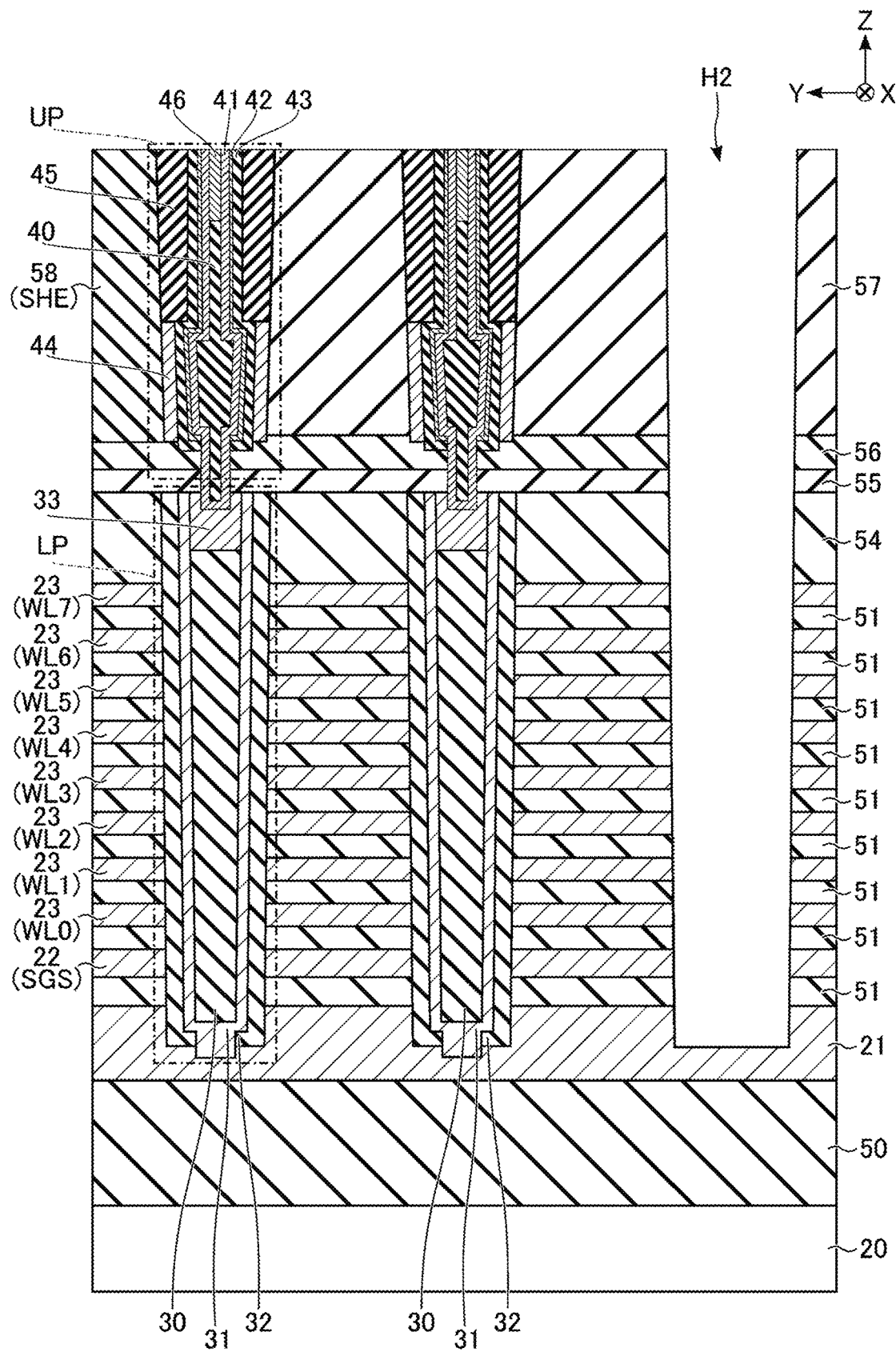
FIG. 23 is a cross-sectional view of the memory cell array illustrating the manufacturing process of the semiconductor storage device of the first embodiment.

As shown in FIG. 23, the conductor is buried in a space from which the sacrificial materials 52 and 53 are removed through the hole H2. For example, CVD is used in the present process. A portion formed in the hole H2 and on the upper surfaces of the sacrificial material 57 and the insulator layer 58 of the conductor is removed by etch back process. Therefore, the conductors formed in the adjacent wire layers are divided, and the conductor layer 22 corresponding to the select gate line SGS and a plurality of conductor layers 23 respectively corresponding to the word lines WL0 to WL7 are formed. The conductor layers 22 and 23 formed in the present process may include barrier metals. In this case, in the formation of the conductor after the removal of the sacrificial materials 52 and 53, for example, after titanium nitride (TiN) is deposited as the barrier metal, tungsten (W) is formed.

Figure 24:
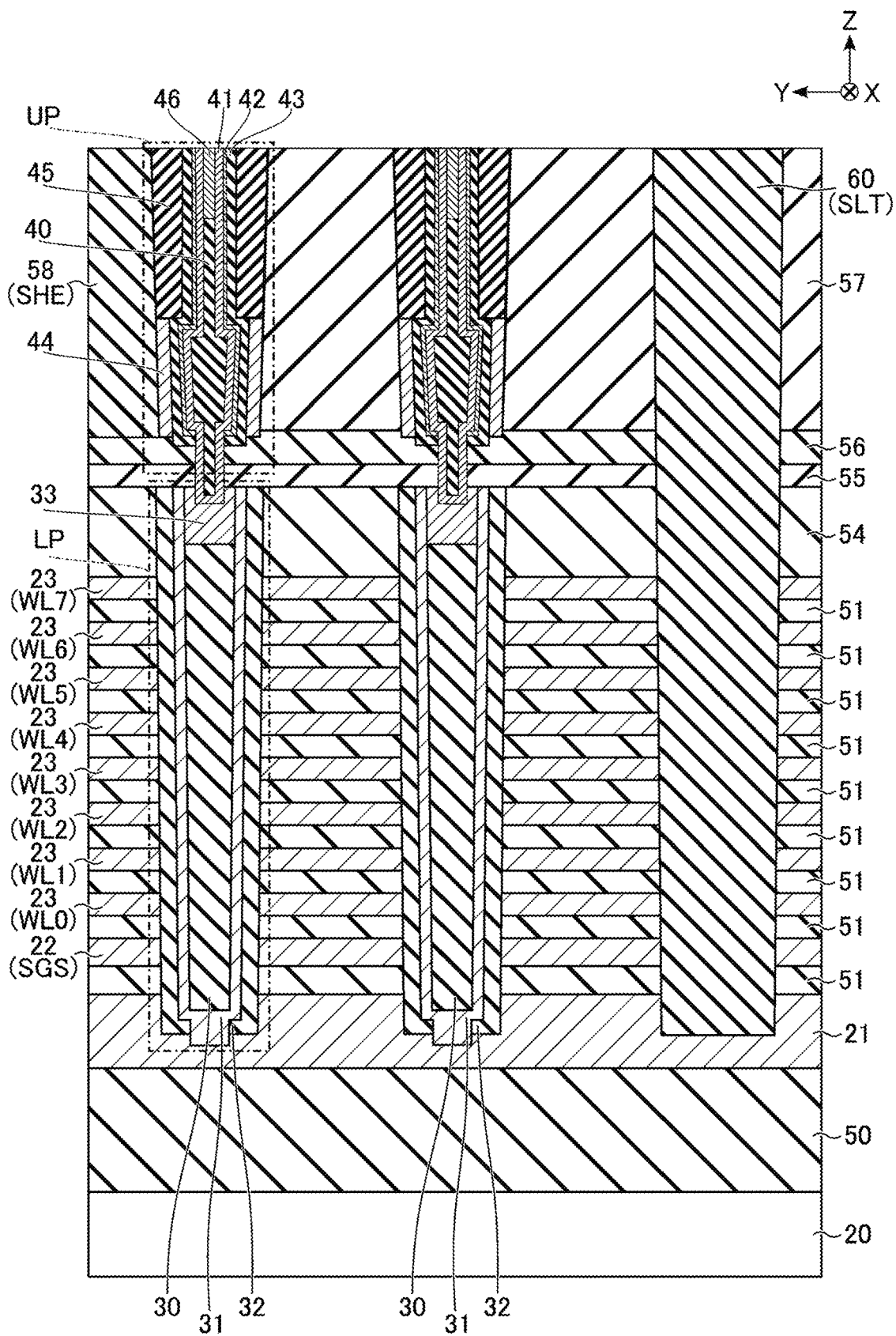
FIG. 24 is a cross-sectional view of the memory cell array illustrating the manufacturing process of the semiconductor storage device of the first embodiment.

Next, as shown in FIG. 24, an insulator layer 60 corresponding to the slit SLT is formed in the hole H2. Specifically, the insulator layer 60 is formed on the sacrificial material 57 and the insulator layer 58 so that the hole H2 is buried. The insulator layer 60 formed in the layer higher than the sacrificial material 57 and the insulator layer 58 is removed, for example, by CMP. The insulator layer 60 includes, for example, silicon oxide ($SiO_2$).

Figure 25:
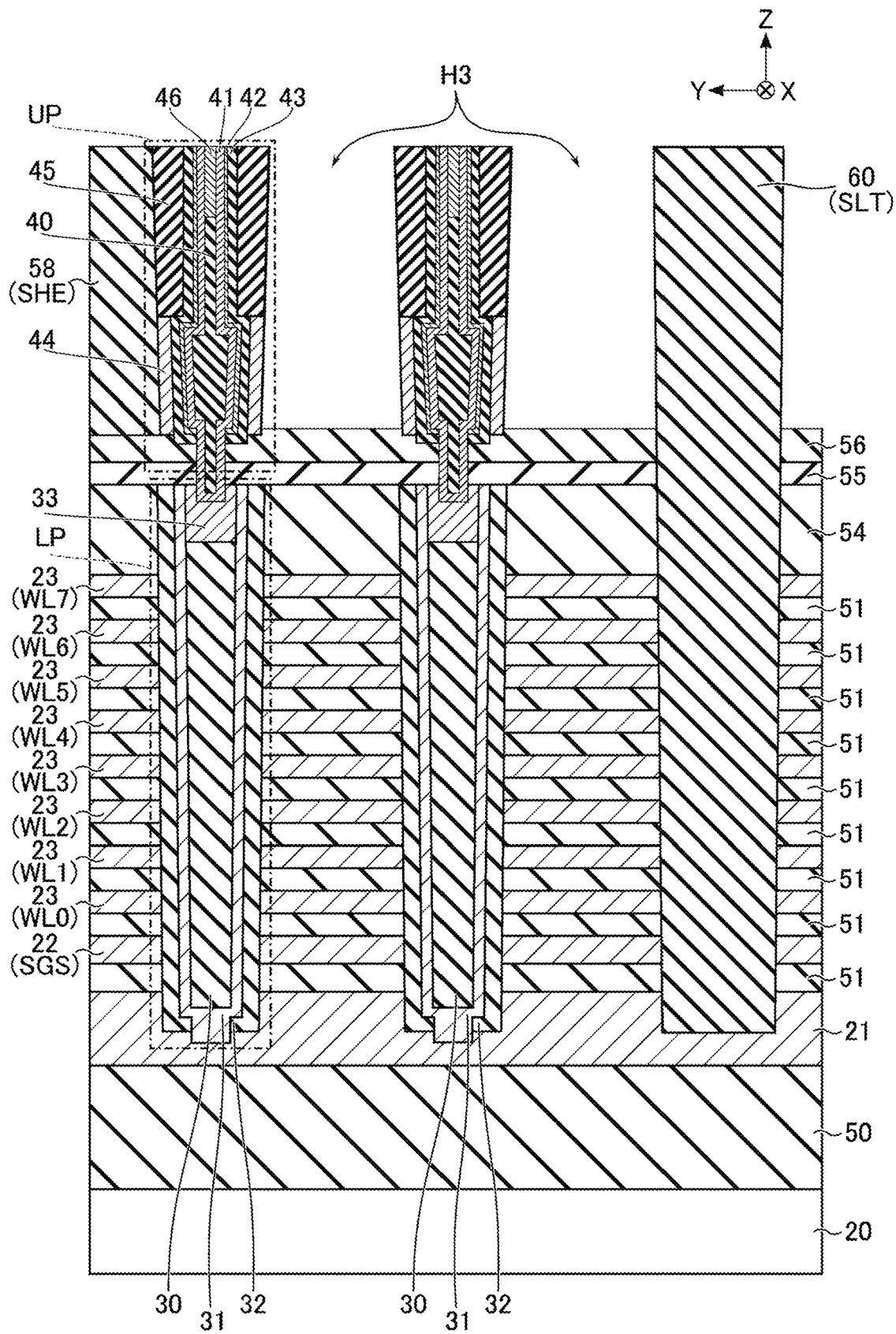
FIG. 25 is a cross-sectional view of the memory cell array illustrating the manufacturing process of the semiconductor storage device of the first embodiment.
Figure 26:
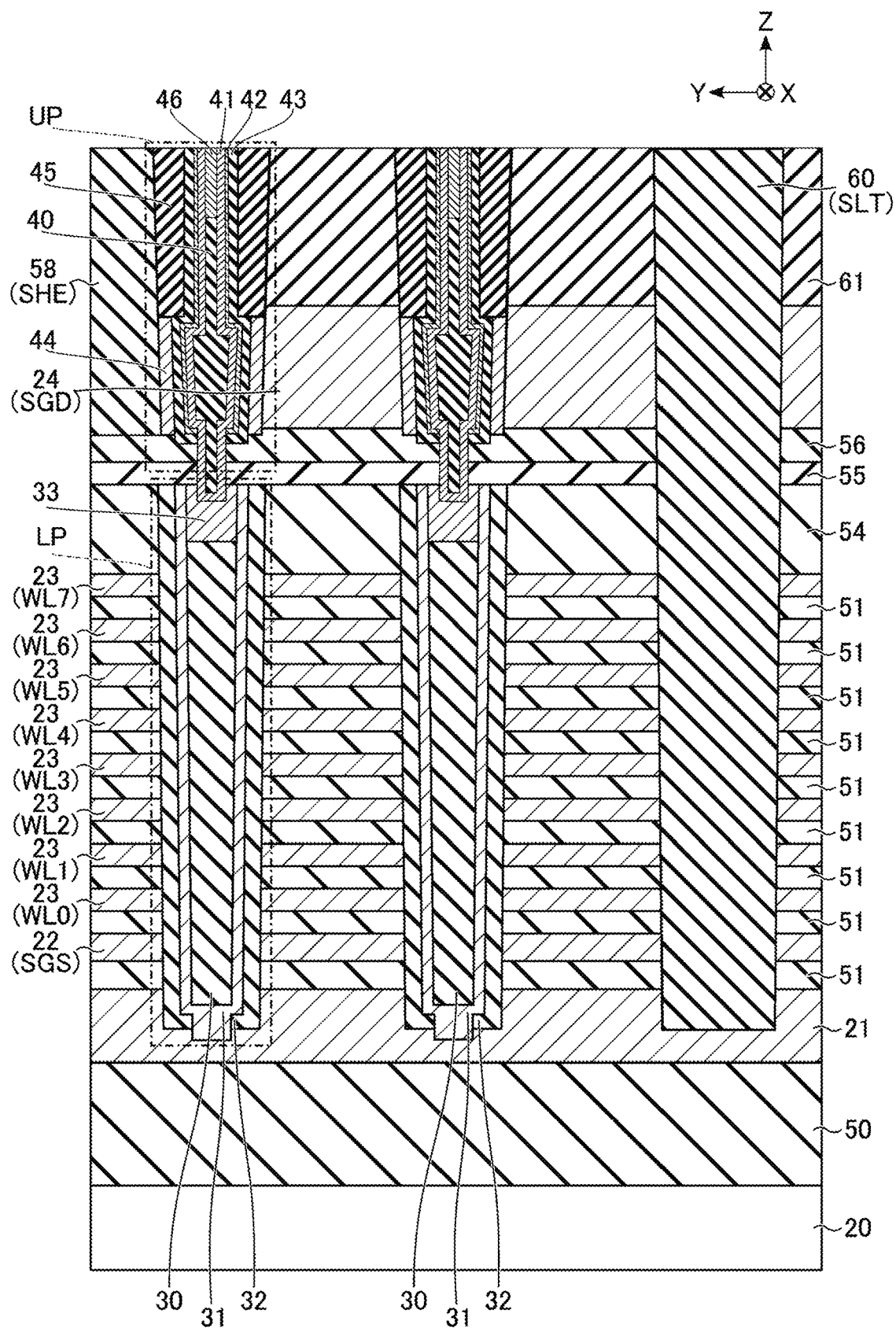
FIG. 26 is a cross-sectional view of the memory cell array illustrating the manufacturing process of the semiconductor storage device of the first embodiment.

Next, as shown in FIGS. 25 and 26, a replacement process of the sacrificial material 57 with the select gate line SGD is executed.

Specifically, as shown in FIG. 25, for example, the sacrificial material 57 is selectively removed by wet etching using hot phosphoric acid. Therefore, holes H3 are formed between the two adjacent insulator layers 58 and between the insulator layer 58 and the insulator layer 60, respectively.

As shown in FIG. 26, the conductor is buried in the hole H3 formed by removing the sacrificial material 57. For example, CVD is used in the present process. Portions of the conductor formed on the upper surfaces of the upper pillar UP and the insulator layers 58 and 60 are removed by etch back process. Therefore, the conductors formed in the adjacent holes H3 are divided, and the conductor layer 24 corresponding to the select gate line SGD is formed. The conductor layer 24 formed in the present process may include a barrier metal. In this case, in the formation of the conductor after the removal of the sacrificial material 57, for example, after titanium nitride (TiN) is deposited as the barrier metal, tungsten (W) is formed. Thereafter, an insulator layer 61 is formed on the conductor layer 24. Specifically, the insulator layer 61 is formed on the conductor layer 24 so that the hole H3 is buried. The insulator layer 61 formed in a layer higher than the upper pillar UP is removed, for example, by CMP. The insulator layer 61 includes, for example, silicon oxide ($SiO_2$).

The memory pillar MP, the source line SL connected to the memory pillar MP, the word line WL, and the select gate lines SGS and SGD are formed by the manufacturing process of the semiconductor storage device according to the first embodiment described above. It should be noted that the manufacturing process described above is merely an example, and other processes may be inserted between each of the manufacturing processes, and the sequence of the manufacturing processes may be changed within a range where no problem occurs.

1.3 Effect of the Present Embodiment

According to the first embodiment, the bottom surface of the hole may be etched while protecting the film formed on the inner wall of the hole. The present effect will be described below with reference to FIGS. 27A and 27B.

Figure 27A:
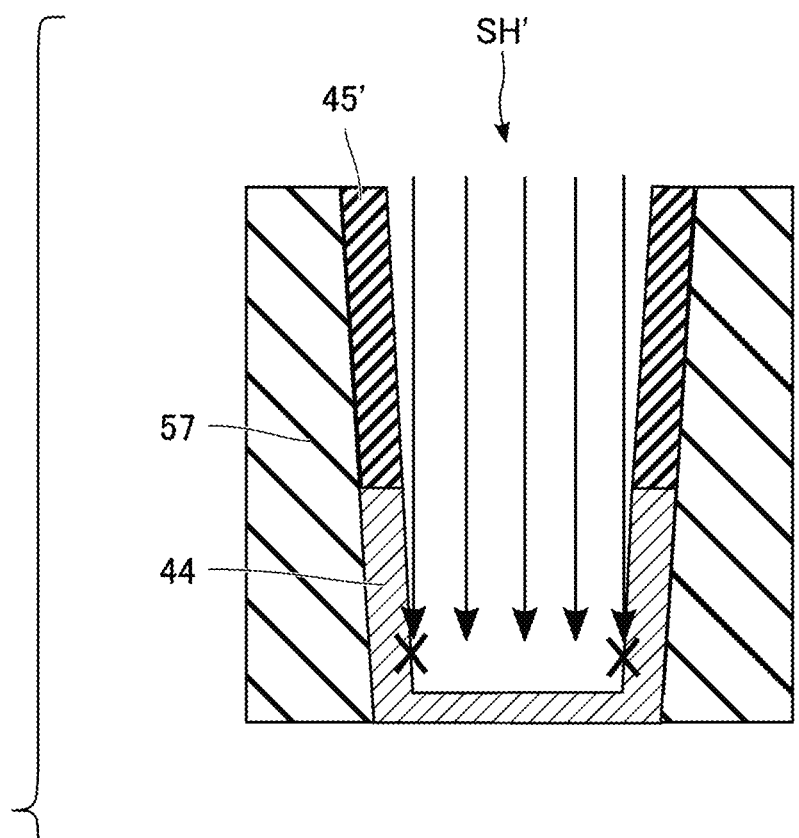
FIGS. 27A and 27B are schematic views illustrating an effect of the first embodiment.
Figure 27B:
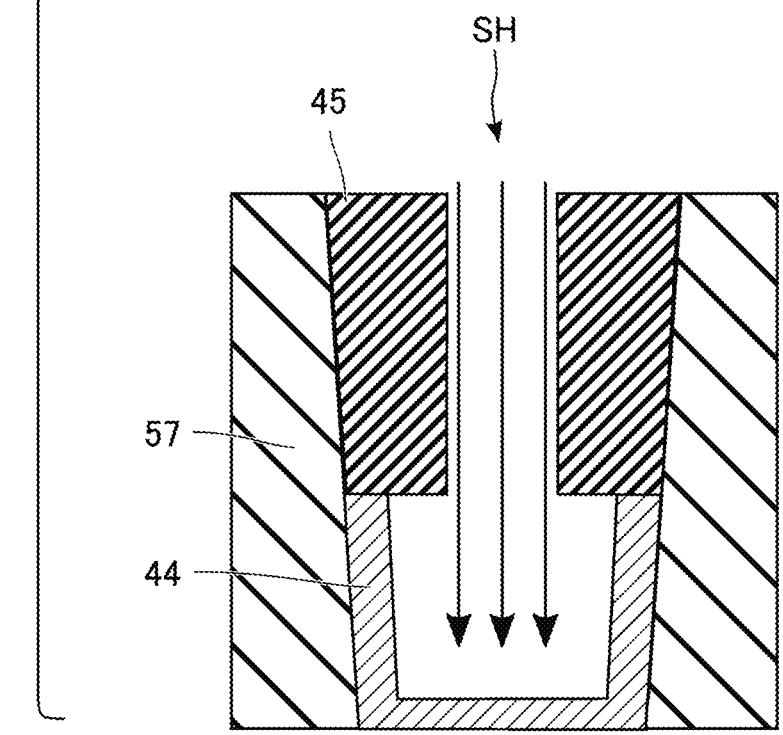

FIGS. 27A and 27B are schematic views illustrating the effect according to the first embodiment. FIGS. 27A and 27B show aspects in which the film formed on the bottom surface of the SGD hole is removed in a comparative example and the first embodiment, respectively. Specifically, FIG. 27A shows an SGD hole SH' according to the comparative example, and FIG. 27B shows the SGD hole SH according to the first embodiment. The comparative example shows a case in which an insulator layer 45' having a film thickness similar to that of the conductor layer 44 is formed on the inner wall of the SGD hole SH' instead of the insulator layer 45.

When removing the film formed on the bottom surface while protecting the film formed on the side surface of the hole, for example, RIE or the like having etching anisotropy is used. However, a shape of the hole may be a tapered shape in which the diameter of the bottom surface is smaller than the diameter of the opening. Therefore, as shown in FIG. 27A, when the insulator layer 45' has the thickness similar to that of the conductor layer 44, there is a possibility that a part of etching gas incident from the opening etches the conductor layer 44 formed on the inner wall nearby the bottom surface.

According to the first embodiment, when the upper pillar UP is formed, the conductor layer 44 and the sacrificial material 59 are sequentially formed in the SGD hole SH, and then the conductor layer 44 and the sacrificial material 59 are removed by the predetermined depth (L2−L1) from the upper end of the corresponding SGD hole SH. After a part of the conductor layer 44 and the sacrificial material 59 are removed, the insulator layer 45 is formed to be thicker than the conductor layer 44 in the SGD hole SH, and the insulator layer 45 formed on the bottom surface of the SGD hole SH and the sacrificial material 59 in the SGD hole SH are removed. Therefore, on the inner wall of the SGD hole SH, the insulating layer 45 having a cylindrical shape thicker than the conductor layer 44 (in other words, as to cover the conductor layer 44 in a bowl shape) is formed on the upper surface of the conductor layer 44 that is formed in a cylindrical shape. Therefore, as shown in FIG. 27B, since the diameter of an opening of the SGD hole SH may be narrowed according to the thickness of the insulator layer 45, it is possible to narrow a region where the etching gas incident from the opening reaches the bottom surface. Therefore, when the conductor layer 44 exposed on the bottom surface is removed after the sacrificial material 59 is removed, it is possible to prevent the incidence of the etching gas on the conductor layer 44 exposed on the inner wall, and it is possible to protect the conductor layer 44 on the inner wall.

As described above, the insulator layer 45 is formed to be thicker than the conductor layer 44. Therefore, the stacked film 43, the semiconductor layers 42 and 41, and the core member 40 which are formed inside the insulator layer 45 and the conductor layer 44 in the SGD hole SH are formed so as to be bent in a direction towards the center of the upper pillar UP in the vicinity of the boundary surface B. Therefore, a structure in which in the stacked film 43, the semiconductor layers 42 and 41, and the core member 40, near the boundary surface B, the diameter from the center of the upper pillar UP rapidly decreases from the lower side to the upper side along the Z direction is formed.

2. Second Embodiment

A semiconductor storage device according to the second embodiment has a structure in which the insulator layer 45 formed in the structure of the semiconductor storage device according to the first embodiment is finally removed. Hereinafter, points of the semiconductor storage device according to the second embodiment which are different from the first embodiment will be described.

2.1 Memory Cell Array

Figure 28:
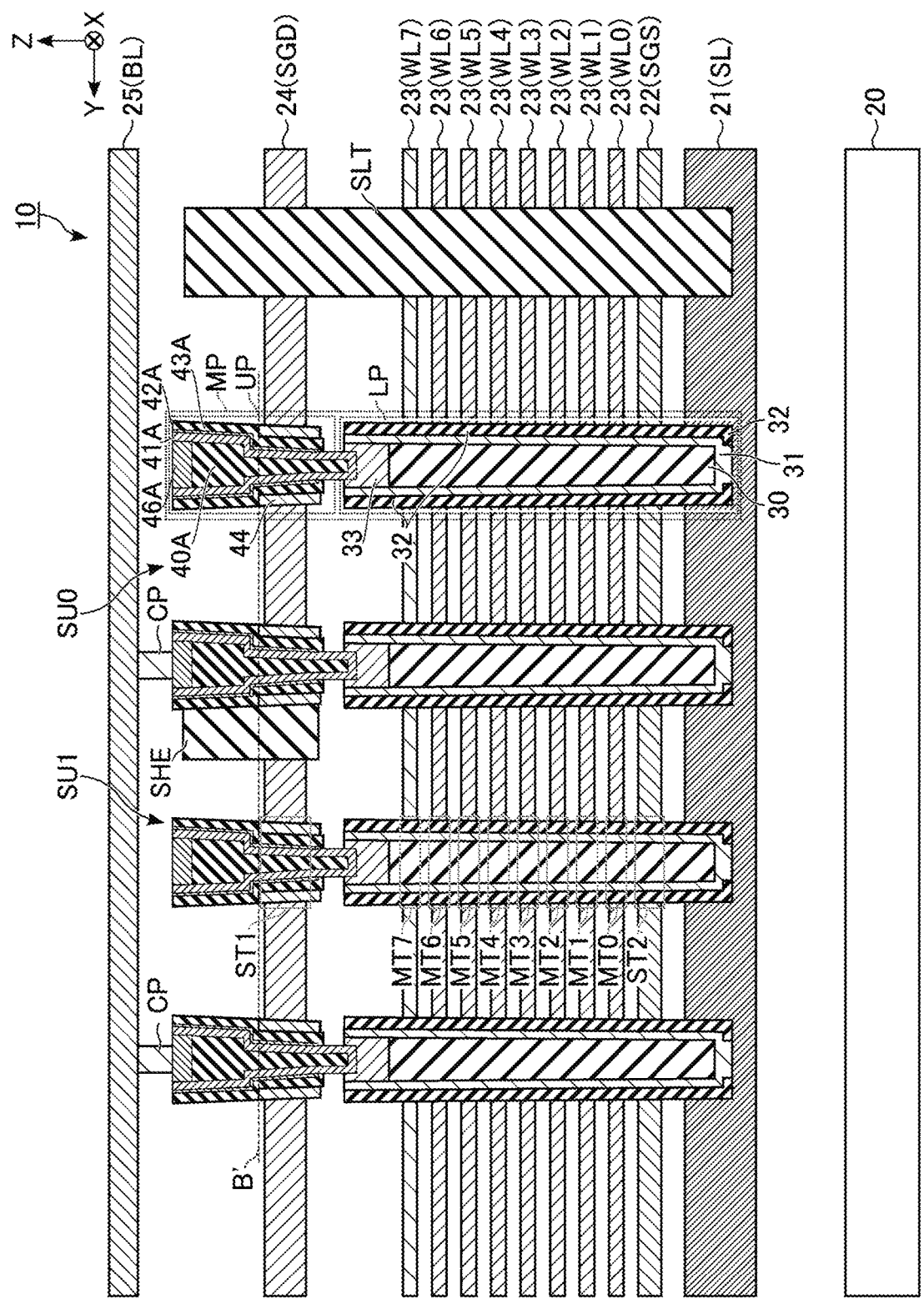
FIG. 28 is a cross-sectional view of a memory cell array of a semiconductor storage device of a second embodiment.

FIG. 28 shows an example of a cross-sectional structure of the memory cell array 10 in the semiconductor storage device according to the second embodiment. As shown in FIG. 28, a structure of the memory cell array 10 according to the second embodiment is different from the structure of the memory cell array 10 described with reference to FIG. 4 in the first embodiment, in a structure of the upper pillar UP. Specifically, the upper pillar UP in the second embodiment is provided with a core member 40A, a semiconductor layer 41A, a semiconductor layer 42A, a stacked film 43A, a conductor layer 44, and a semiconductor portion 46A.

The core member 40A extends along the Z direction, and an outer diameter of the cross section along the XY plane nearby a boundary surface B' formed along the XY plane by the upper surface of the conductor layer 44 and the stacked film 43A largely changes. In an example of FIG. 28, in the core member 40A, near the boundary surface B', a diameter of an upper portion is larger than a diameter of a lower portion.

The semiconductor layer 41A covers a side surface and a bottom surface of the core member 40A, the semiconductor layer 42A covers a part of a side surface of the semiconductor layer 41A, the stacked film 43A covers a side surface of the semiconductor layer 42A, and each includes a portion provided in a cylindrical shape.

The semiconductor layer 41A, the semiconductor layer 42A, and the stacked film 43A are all provided along the Z direction across the boundary surface B'. In each of the semiconductor layer 41A, the semiconductor layer 42A, and the stacked film 43A, thicknesses of the cross section along the XY plane are substantially uniform along the Z direction except for the boundary surface B'. Therefore, similarly to the core member 40A, in the semiconductor layer 41A, the semiconductor layer 42A, and the stacked film 43A, outer diameters and inner diameters of the cross section along the XY plane largely change near the boundary surface B'. In the example of FIG. 28, a diameter of a portion between the semiconductor layers 41A and 42A and the conductor layer 24 in the stacked film 43A is smaller than a diameter of a portion between the semiconductor layers 41A and 42A and the insulator layer formed above the conductor layer 24.

The conductor layer 44 covers a portion of a side surface of the stacked film 43A below the boundary surface B'. The conductor layer 44 is in contact with the stacked film 43A at the boundary surface B' (that is, on the upper surface of the conductor layer 44).

The side surface of the upper pillar UP is formed by the stacked film 43A above the boundary surface B'. On the other hand, below the boundary surface B', the side surface of the upper pillar UP is formed by the conductor layer 44, and the stacked film 43A is formed inside the conductor layer 44. Therefore, a significant change occurs in sizes of the diameters of the cross section along the XY plane at the boundary surface B' of the core member 40A, the semiconductor layer 41A, the semiconductor layer 42A, and the stacked film 43A as described above.

The semiconductor portion 46A covers an upper surface of the core member 40A and is in contact with an inner wall of a portion of the semiconductor layer 41A provided above the core member 40A. The semiconductor portion 46A is provided, for example, in a cylindrical shape, and reaches the upper end of the upper pillar UP. As described above, the diameter of the semiconductor layer 41A largely changes from a lower side to an upper side nearby the boundary surface B'. Therefore, the inner diameter of the semiconductor layer 41A at the upper end of the upper pillar UP may be larger than the inner diameter of the semiconductor layer 41 in the first embodiment. Thus, the diameter of the semiconductor portion 46A at the upper end of the upper pillar UP may be larger than the diameter of the semiconductor portion 46 in the first embodiment.

2.2 Method of Manufacturing Semiconductor Storage Device

Hereinafter, in the semiconductor storage device according to the second embodiment, portions different from the first embodiment in a series of manufacturing processes from the formation of the stacked structure corresponding to the word line WL to the formation of the select gate line SGD will be described. Each of FIGS. 29 to 33 shows an example of a cross-sectional structure including a structure corresponding to a memory cell array in the manufacturing process of the semiconductor storage device according to the second embodiment.

First, various processes in FIGS. 8 to 17 described in the first embodiment are executed. Therefore, when forming the upper pillar UP, the conductor layer 44 of the bottom portion of each SGD hole SH is removed by anisotropic etching. As described in the first embodiment, on the inner wall of the SGD hole SH, the insulator layer 45 of the cylindrical shape, which is thicker than the conductor layer 44 is formed on the upper surface of the conductor layer 44 that is formed in the cylindrical shape. Therefore, when the conductor layer 44 exposed to the bottom surface of the SGD hole SH is removed, it is possible to prevent the incidence of the etching gas to the conductor layer 44 exposed to the inner wall, and thus it is possible to protect the conductor layer 44 of the inner wall.

Figure 29:
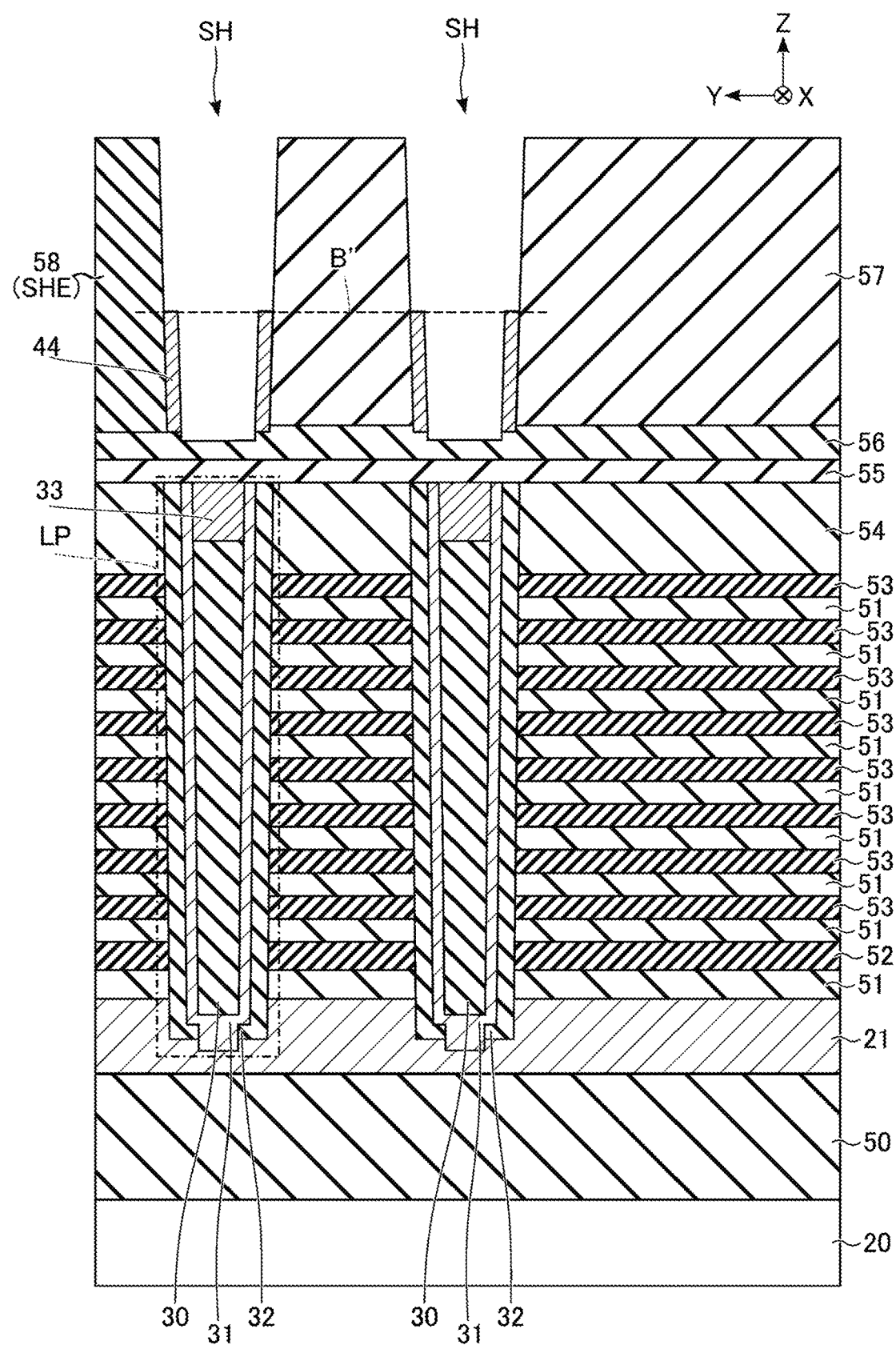
FIG. 29 is a cross-sectional view of the memory cell array illustrating a manufacturing process of the semiconductor storage device of the second embodiment.
Figure 30:
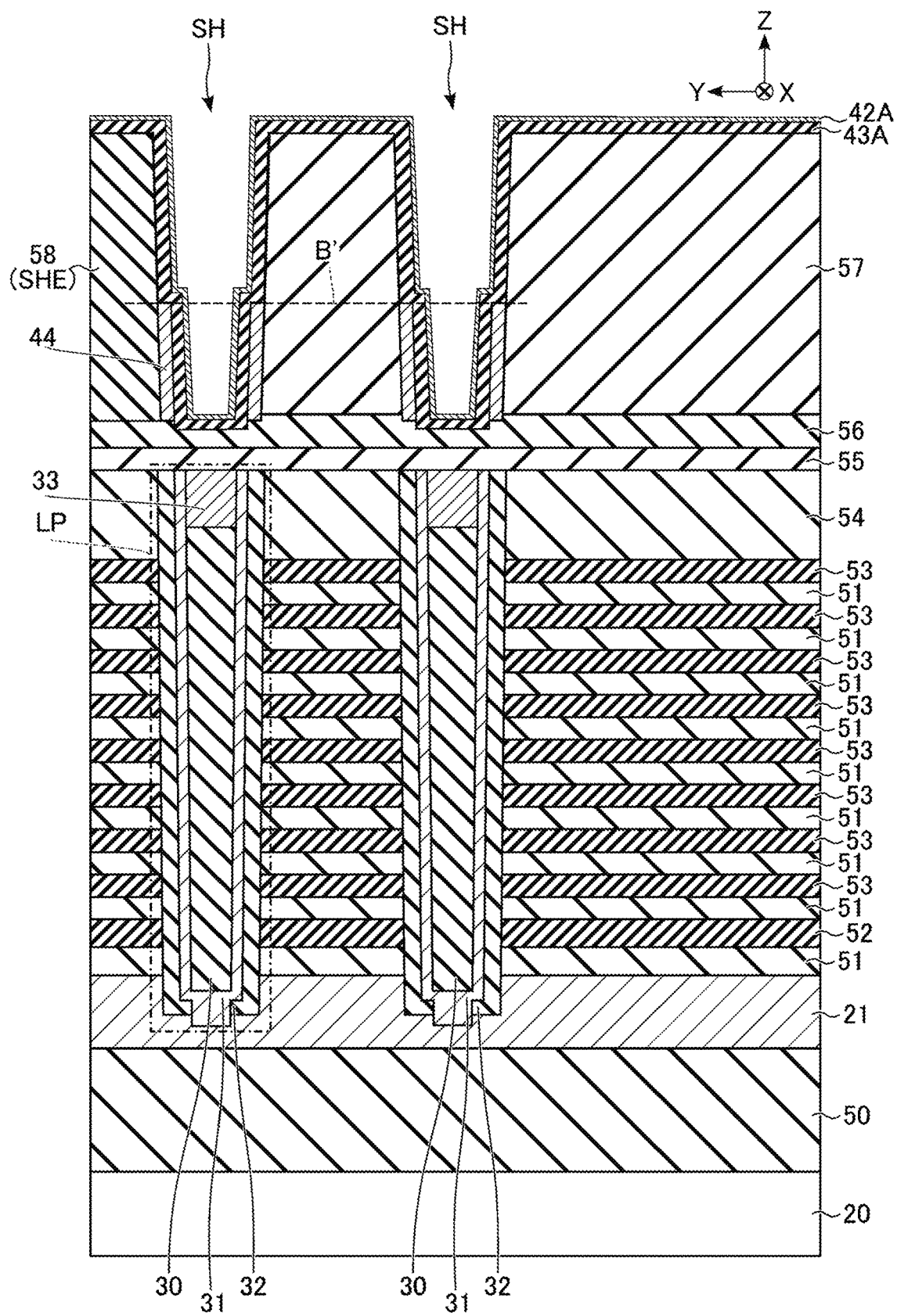
FIG. 30 is a cross-sectional view of the memory cell array illustrating the manufacturing process of the semiconductor storage device of the second embodiment.

As shown in FIGS. 29 and 30, after the insulator layer 45 is removed, the stacked film 43A and the semiconductor layer 42A are sequentially formed on the sacrificial material 57 and the insulator layer 58 and in the SGD hole SH. In the stacked film 43A and the semiconductor layer 42A in the SGD hole SH, the size of the diameter of the cross section along the XY cross section changes above and below near the boundary surface B'. Specifically, in the stacked film 43A and the semiconductor layer 42A, the upper diameter near the boundary surface B' is larger than the lower diameter.

Figure 31:
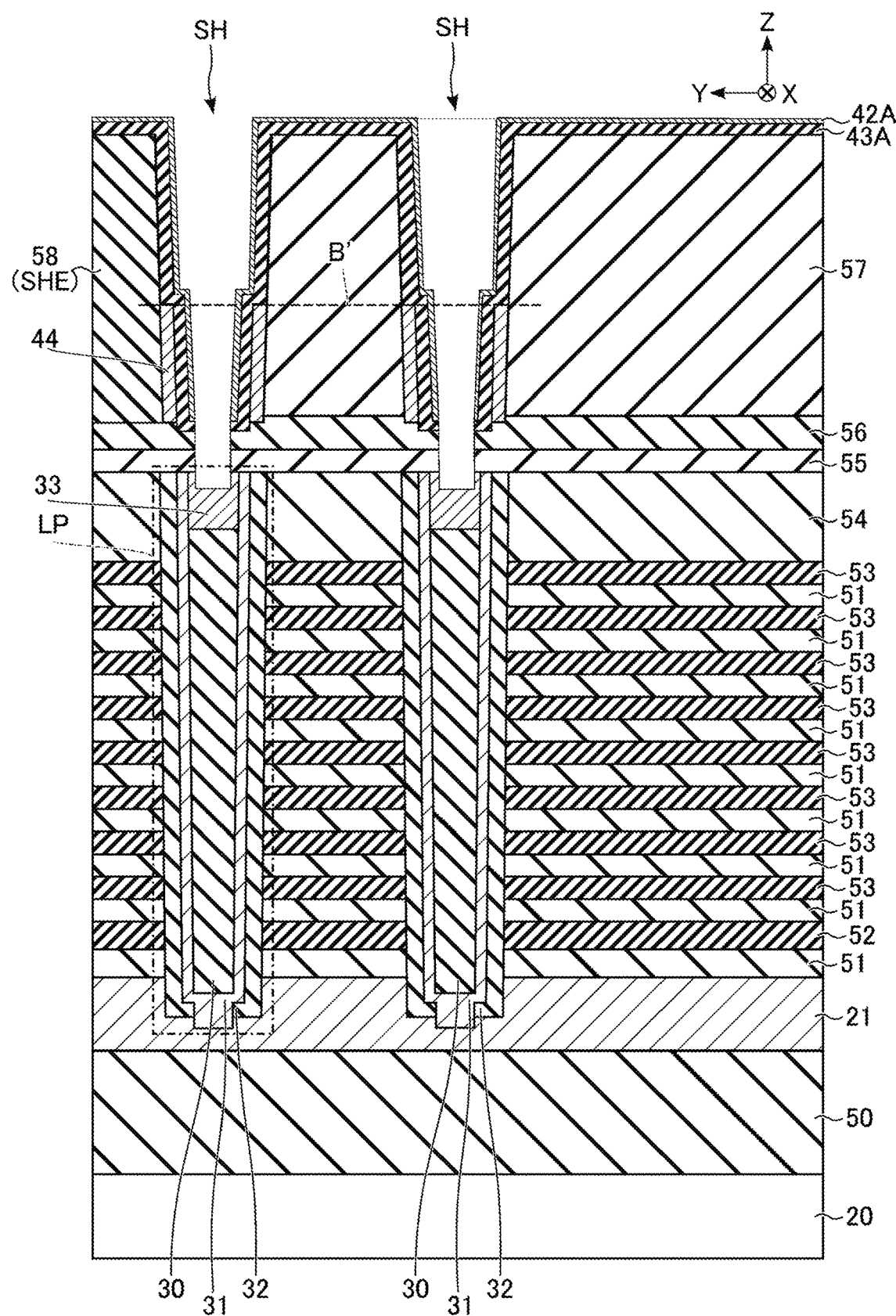
FIG. 31 is a cross-sectional view of the memory cell array illustrating the manufacturing process of the semiconductor storage device of the second embodiment.

As shown in FIG. 31, the semiconductor layer 42A and the stacked film 43A of the bottom portion of the SGD hole SH are removed by anisotropic etching. The SGD hole SH formed in the present process penetrates the etching stop layer 56 and the insulator layer 55, and the bottom portion of the SGD hole SH stops, for example, in the semiconductor portion 33 of the lower pillar LP. The anisotropic etching in the present process is, for example, RIE.

Figure 32:
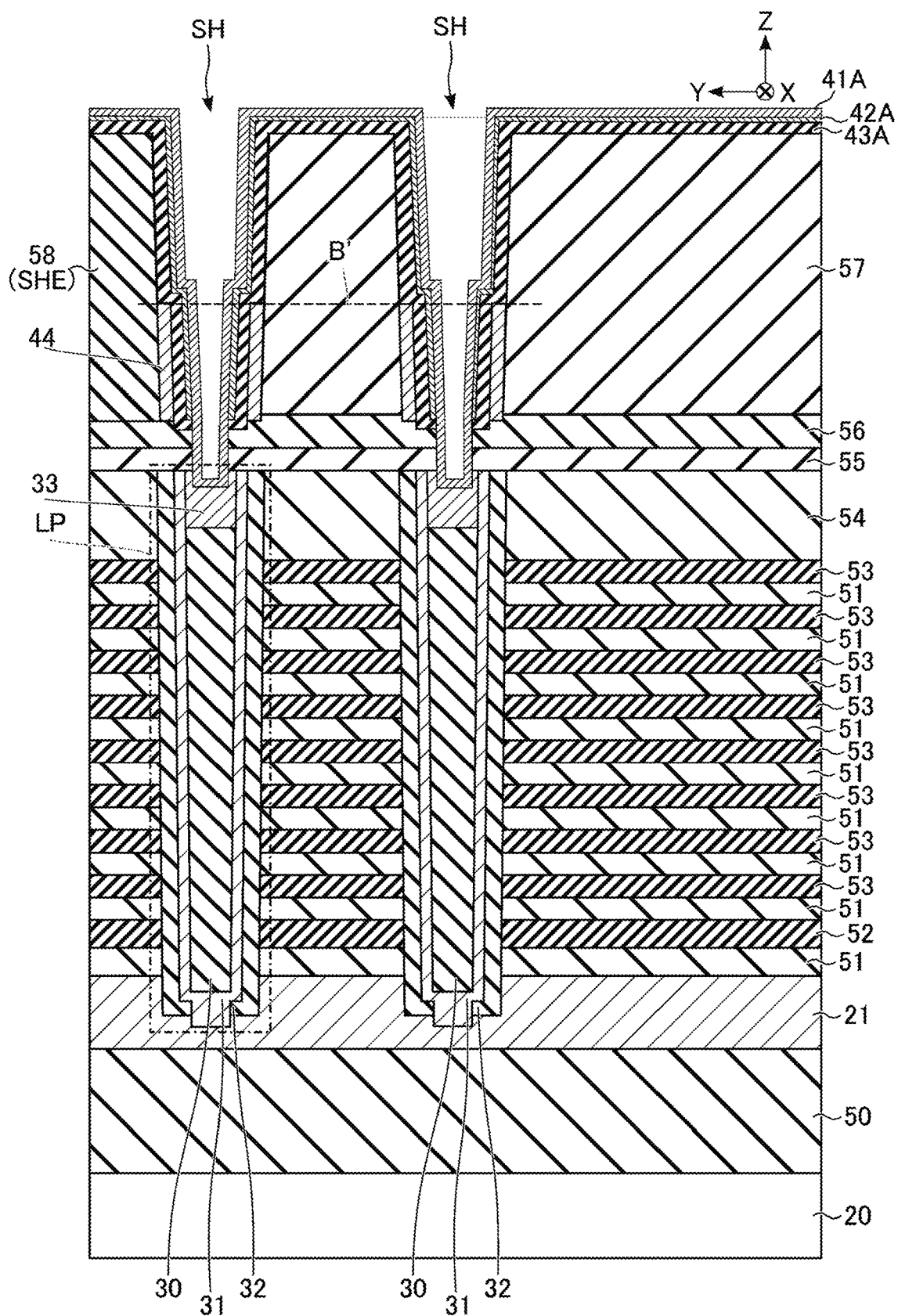
FIG. 32 is a cross-sectional view of the memory cell array illustrating the manufacturing process of the semiconductor storage device of the second embodiment.
Figure 33:
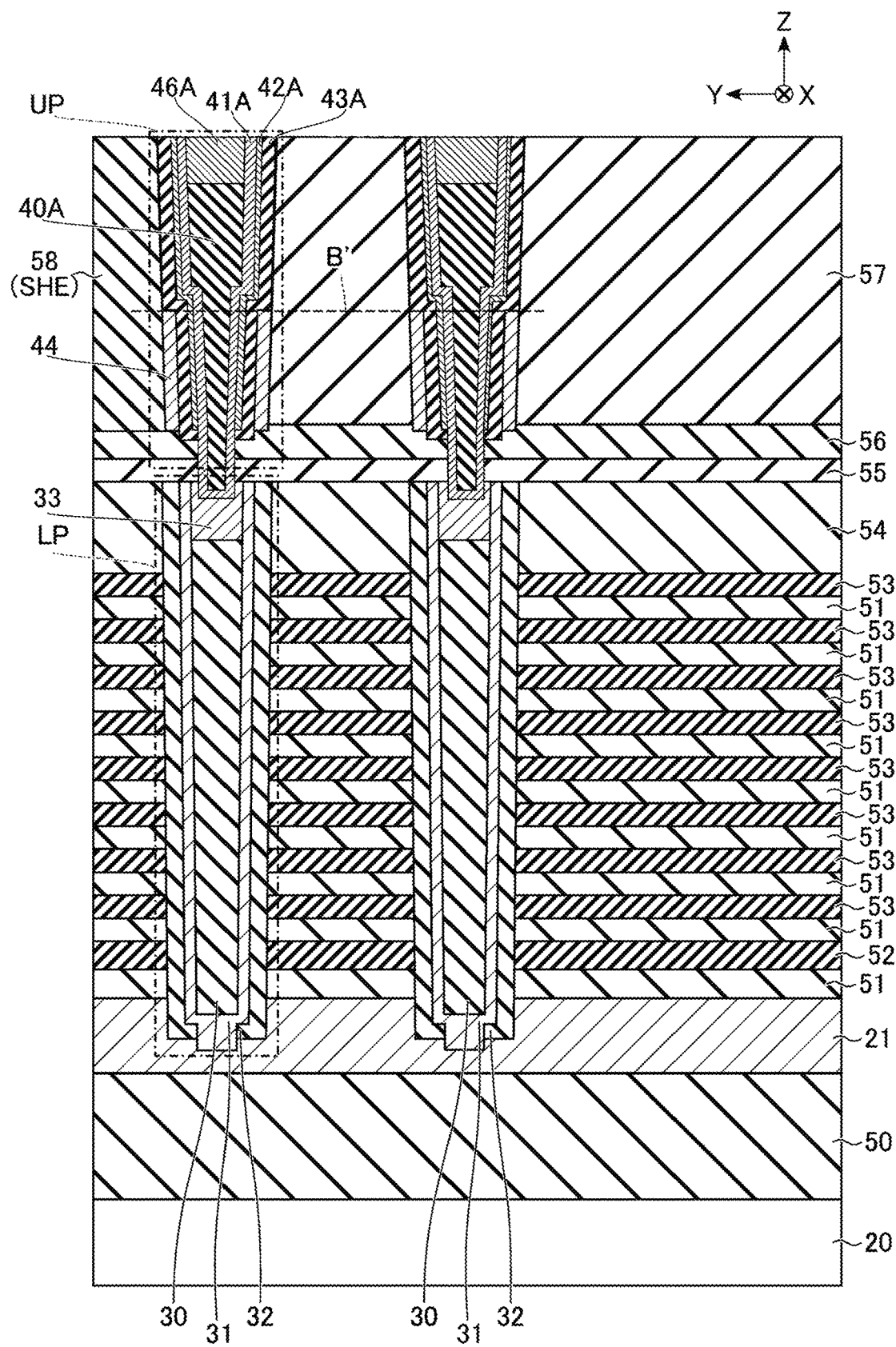
FIG. 33 is a cross-sectional view of the memory cell array illustrating the manufacturing process of the semiconductor storage device of the second embodiment.

As shown in FIGS. 32 and 33, the semiconductor layer 41A and the core member 40A are sequentially formed on the sacrificial material 57 and the insulator layer 58, and in the SGD hole SH. Similarly to the semiconductor layer 42A and the stacked film 43A, in the semiconductor layer 41A and the core member 40A in the SGD hole SH, the upper diameter near the boundary surface B' is larger than the lower diameter. Thereafter, a part of the core member 40A formed on the SGD hole SH is removed, and the semiconductor portion 46A is buried in the space. The stacked film 43A, the semiconductor layer 42A, the semiconductor layer 41A, the core member 40A, and the semiconductor portion 46A remaining in the layer higher than the sacrificial material 57 and the insulator layer 58 are removed, for example, by CMP. Therefore, the upper pillar UP is formed in the SGD hole SH.

The subsequent processes are the same as the processes in FIGS. 22 to 26 described in the first embodiment, and thus the description thereof will be omitted.

2.3 Effect of the Present Embodiment

In the second embodiment, when the conductor layer 44 on the bottom surface of the SGD hole SH is removed by the manufacturing process similar to that of the first embodiment, the insulator layer 45 of the cylindrical shape, which is thicker than the conductor layer 44 is formed on the upper surface of the conductor layer 44 formed in the cylindrical shape in the inner wall of the SGD hole SH. Therefore, similarly to the first embodiment, it is possible to remove the film on the bottom surface while protecting the film on the inner wall of the hole.

It should be noted that in the second embodiment, after the conductor layer 44 on the bottom surface of the SGD hole SH is removed, the insulator layer 45 is removed. Therefore, the stacked film 43A, the semiconductor layers 42A and 41A, and the core member 40A formed in the SGD hole SH are formed to be bent in a direction away from the center of the upper pillar UP at the boundary surface B'. Thus, in the stacked film 43A, the diameter of the portion between the semiconductor layers 42A and 41A and the conductor layer 44 is smaller than the diameter of the portion between the semiconductor layers 42A and 41A and the insulator layer 61. Accordingly, the diameter of the semiconductor portion 46A at the upper end of the upper pillar UP becomes larger than when the insulator layer 45 is not removed. Therefore, it is possible to increase an area of the semiconductor portion 46A at the upper end of the upper pillar UP, and thus it is possible to secure a margin of deviation regarding the contact CP connected to the upper pillar UP.

3. Modified Example and the Like

It should be noted that various modifications may be made to the first embodiment and the second embodiment described above.

3.1 First Modification Example

For example, in the first embodiment and the second embodiment described above, when forming the upper pillar UP, the method of removing the conductor layer 44 of the bottom portion while protecting the conductor layer 44 of the side wall of the SGD hole SH is described, however, the same method may be applied to the formation of the lower pillar LP.

Each of FIGS. 34 to 38 shows an example of a cross-sectional structure including a structure corresponding to the memory cell array in the manufacturing process of the semiconductor storage device according to the first modified example.

First, various processes in FIGS. 8 and 9 described in the first embodiment are executed. Therefore, when the lower pillar LP is formed, the memory hole MH is formed.

Figure 34:
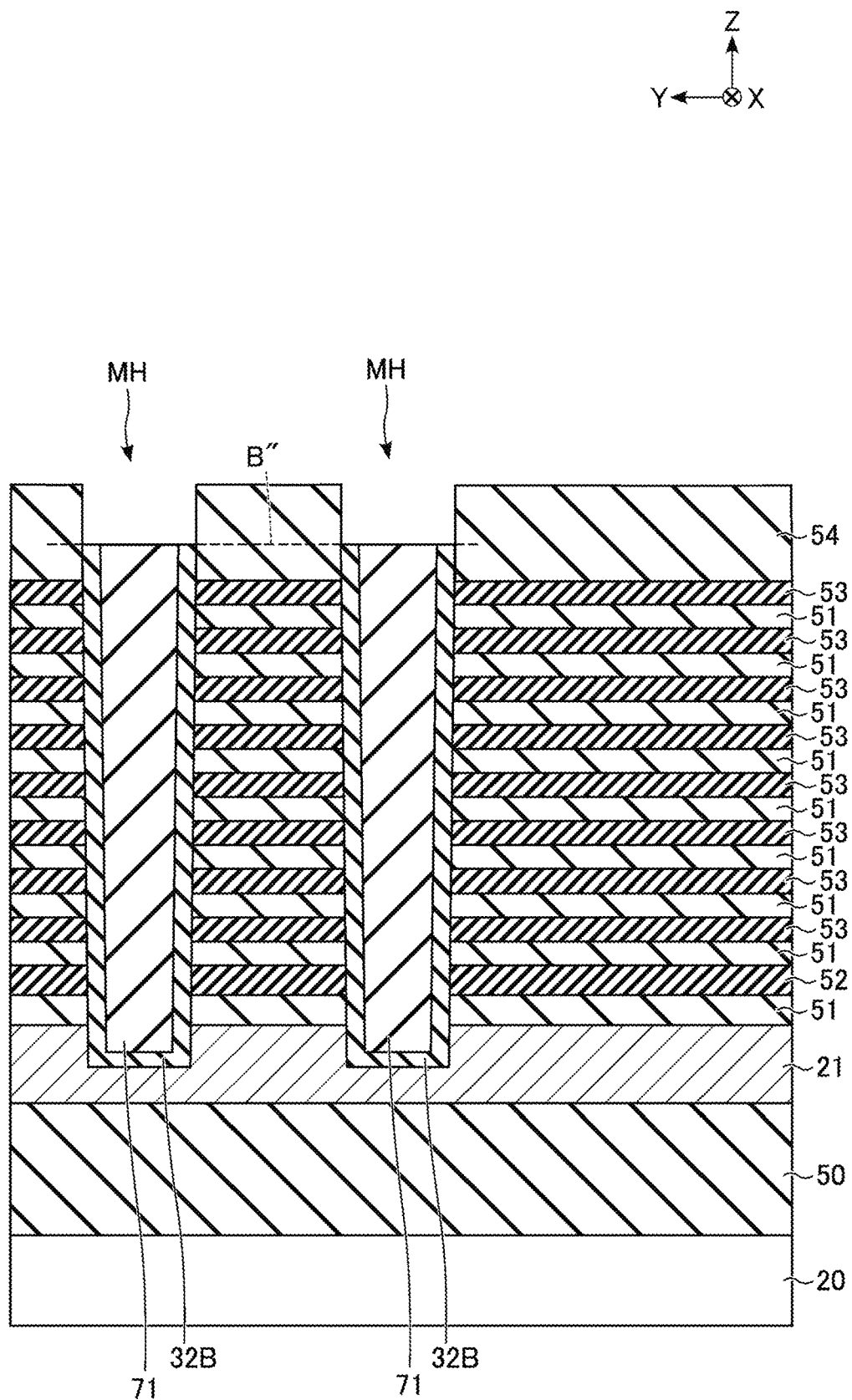
FIG. 34 is a cross-sectional view of a memory cell array illustrating a manufacturing process of a semiconductor storage device of a first modified example.

As shown in FIG. 34, a stacked structure is formed to a desired height L1' from the bottom portion of the memory hole MH. The height L1' is shorter than a height L2' from the bottom portion of the memory hole MH to the opening (L1' <L2'). More specifically, a stacked film 32B and a sacrificial material 71 are sequentially stacked on the insulator layer 54, and the sacrificial material 71 is removed to a predetermined depth (L1'-L2') in the memory hole MH, for example, by etch back process. Thereafter, the stacked film 32B is removed to the height L1' of the sacrificial material 71 remaining in the memory hole MH by additional etch back process. Upper surfaces of the stacked film 32B and the sacrificial material 71 correspond to a boundary surface B".

Figure 35:
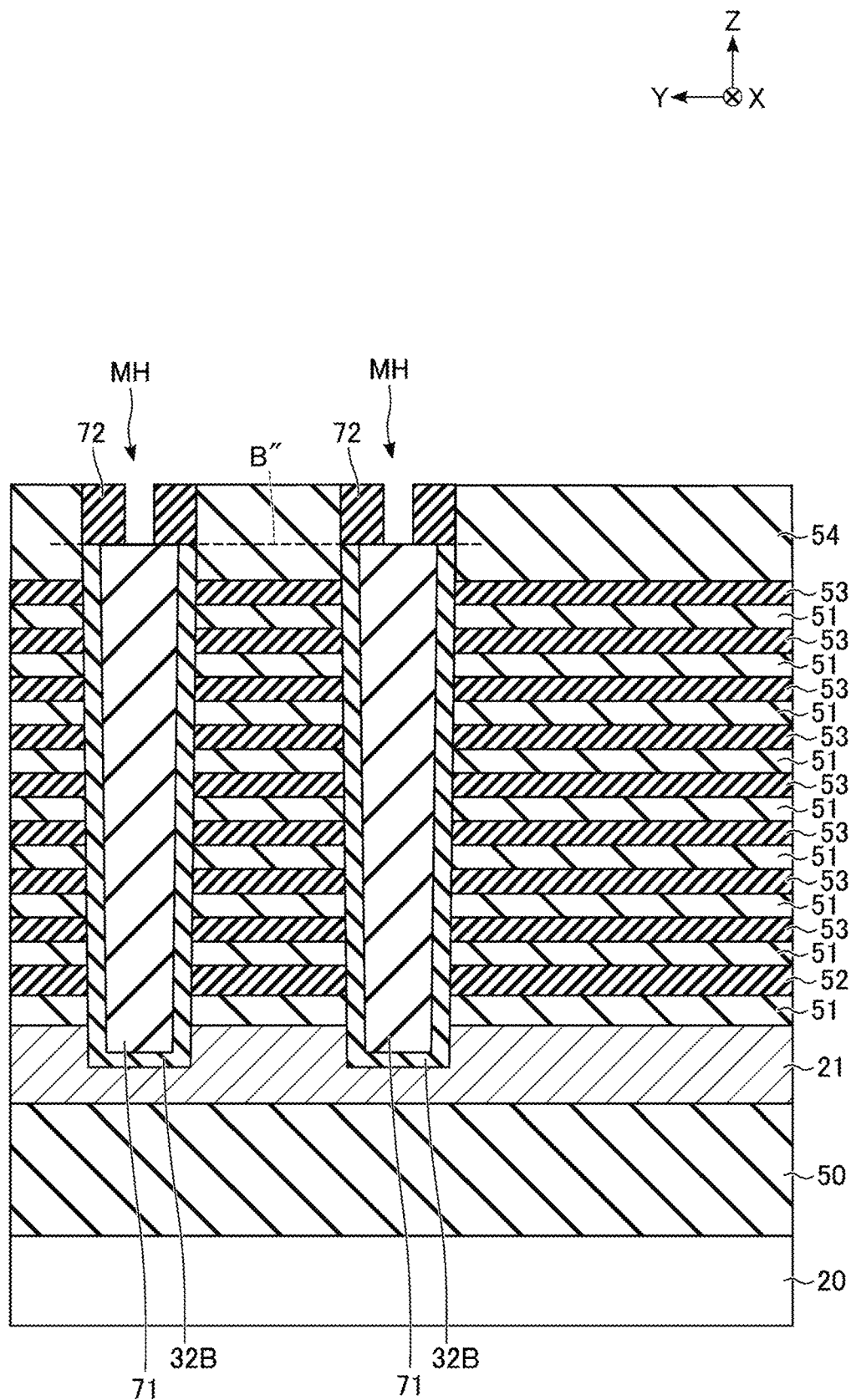
FIG. 35 is a cross-sectional view of the memory cell array illustrating the manufacturing process of the semiconductor storage device of the first modified example.

As shown in FIG. 35, an insulator layer 72 is formed on a remaining inner wall of the memory hole MH. Here, the insulator layer 72 is formed to be thicker than the stacked film 32B. Therefore, an inner diameter of the insulator layer 72 in the memory hole MH nearby the boundary surface B" is smaller than the inner diameter of the stacked film 32B.

Figure 36:
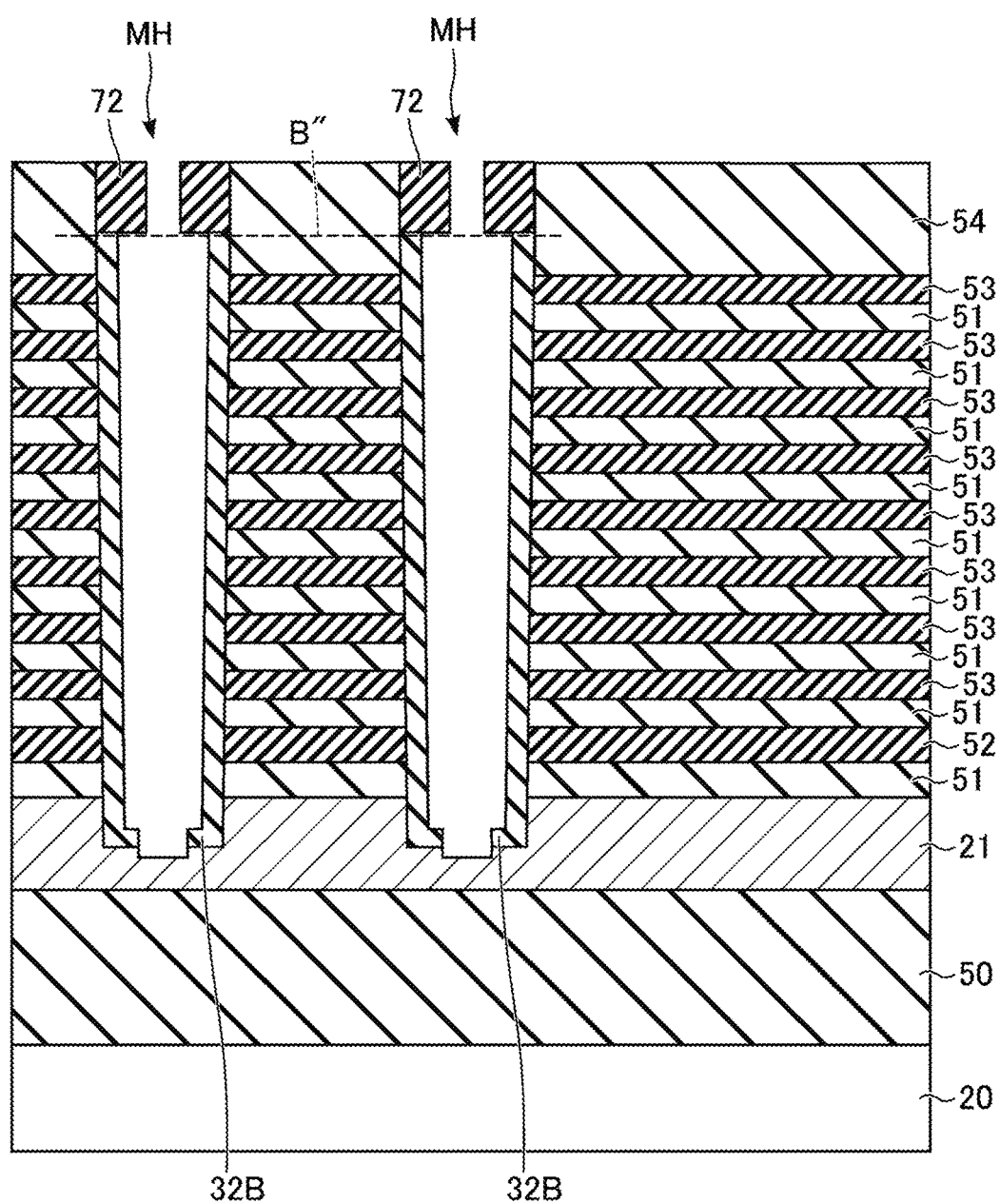
FIG. 36 is a cross-sectional view of the memory cell array illustrating the manufacturing process of the semiconductor storage device of the first modified example.

As shown in FIG. 36, after the sacrificial material 71 is removed by etch back process, the stacked film 32B of the bottom portion of the memory hole MH is removed by anisotropic etching. Therefore, the upper surface of the conductor layer 21 is exposed in the bottom portion of each memory hole MH. The anisotropic etching in the present process is, for example, RIE. Although RIE has etching anisotropy in the Z direction, RIE may have some etching components also in the XY directions. However, since the diameter of the opening in memory hole MH to which the etching gas is incident is narrower than the diameter below the boundary surface B" in the memory hole MH, the etching component regarding the stacked film 32B formed on the side wall of the memory hole MH decreases. Therefore, it is possible to more selectively etch the stacked film 32B of the bottom portion of the memory hole MH.

Figure 37:
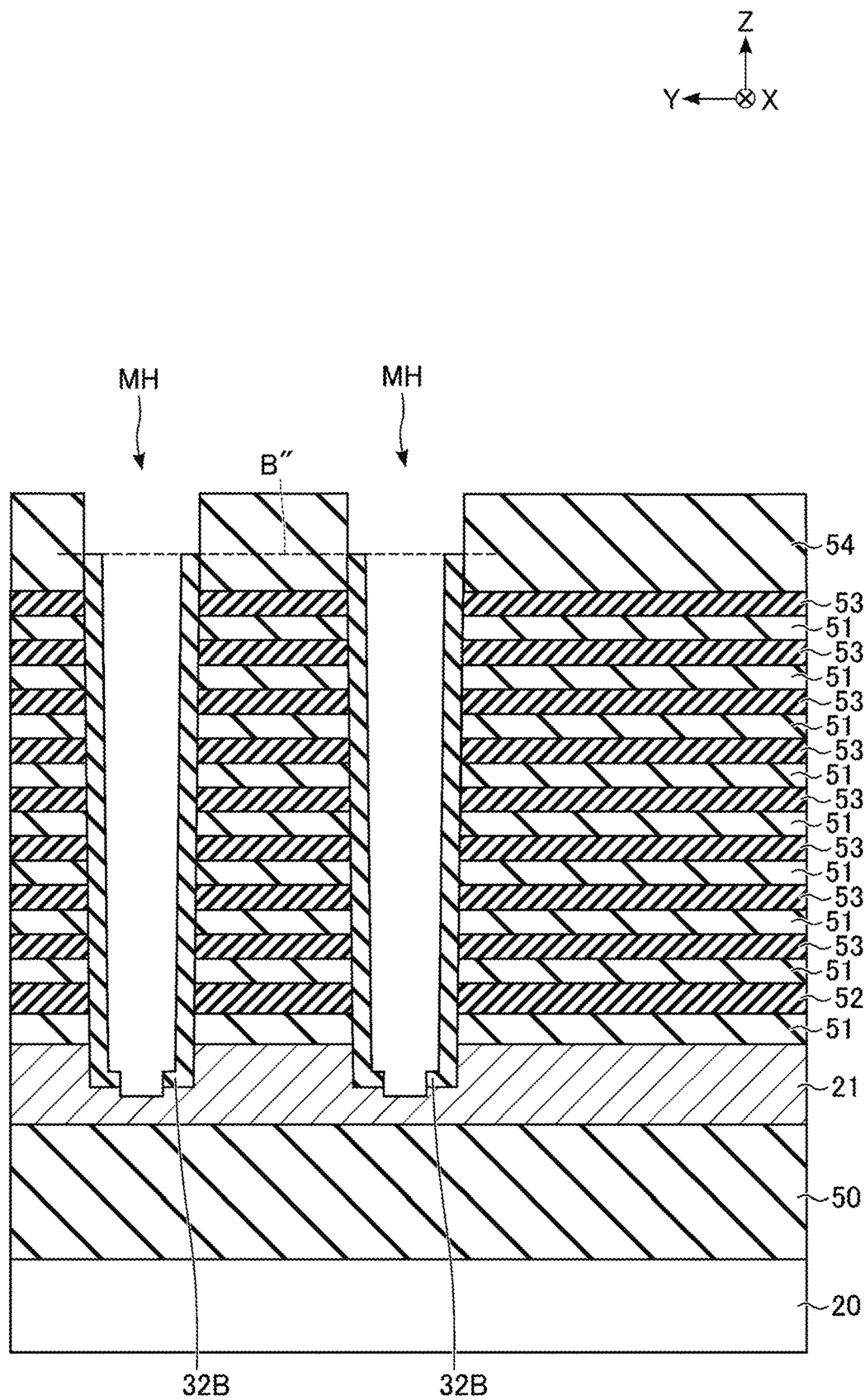
FIG. 37 is a cross-sectional view of the memory cell array illustrating the manufacturing process of the semiconductor storage device of the first modified example.
Figure 38:
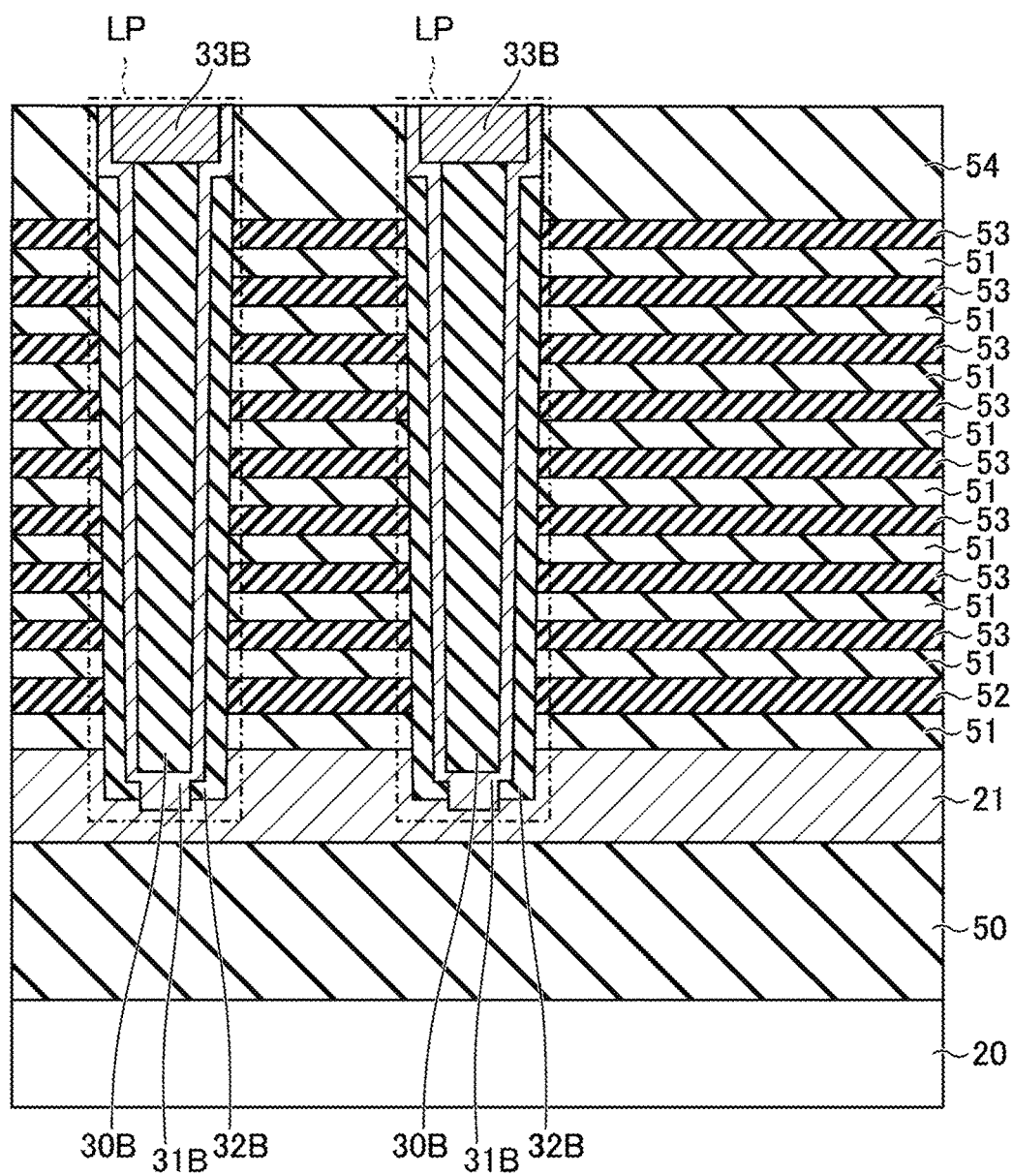
FIG. 38 is a cross-sectional view of the memory cell array illustrating the manufacturing process of the semiconductor storage device of the first modified example.

Thereafter, as shown in FIGS. 37 and 38, after the insulator layer 72 is removed, a semiconductor layer 31B and a core member 30B are sequentially formed on the insulator layer 54 and in the memory hole MH. In the semiconductor layer 31B in the memory hole MH, an upper diameter near the boundary surface B" is larger than a lower diameter. Thereafter, a part of the core member 30B formed above the memory hole MH is removed, and a semiconductor portion 33B is buried in the corresponding space. The semiconductor layer 31B, the core member 30B, and the semiconductor portion 33B remaining in a layer higher than the insulator layer 54 are removed, for example, by CMP. Therefore, the lower pillar LP is formed in the memory holes MH.

In the first modified example, when the stacked film 32B on the bottom surface of the memory hole MH is removed, the insulator layer 72 of a cylindrical shape, which is thicker than the stacked film 32B is formed on the upper surface of stacked film 32B that is formed in a cylindrical shape among the inner walls of the memory hole MH. Therefore, similarly to the first embodiment and the second embodiment, it is possible to remove the film of the bottom surface while protecting the film on the inner wall of the hole.

3.2 Others

In the first embodiment and the second embodiment described above, a case in which the semiconductor storage device 1 has the structure in which the circuits such as the sense amplifier module 16 are provided below the memory cell array 10 is described as an example, however, the present disclosure is not limited thereto. For example, the semiconductor storage device 1 may have a structure in which the memory cell array 10 and the sense amplifier module 16 are formed on the semiconductor substrate 20. The semiconductor storage device 1 may have a structure in which a chip provided with the sense amplifier module 16 and the like and a chip provided with the memory cell array 10 are bonded together.

In the embodiments described above, the structure in which the word line WL and the select gate line SGS are adjacent to each other, and the word line WL and the select gate line SGD are adjacent to each other is described, however, the present disclosure is not limited thereto. For example, a dummy word line may be provided between the word line WL of the uppermost layer and the select gate line SGD. Similarly, a dummy word line may be provided between the word line WL of the lowermost layer and the select gate line SGS. In a structure in which a plurality of pillars are connected, the conductor layer near the connection portion may be used as the dummy word line.

In the embodiments described above, a case in which the semiconductor layer 31 and the conductor layer 21 are electrically connected with each other through the bottom portion of the memory pillar MP is illustrated, however, the present disclosure is not limited thereto. The semiconductor layer 31 and the conductor layer 21 may be electrically connected with each other through the side surface of the memory pillar MP. In this case, a part of the stacked film 32 formed on the side surface of the memory pillar MP is removed, and a structure in which the semiconductor layer 31 and the conductor layer 21 are in contact with each other through the corresponding portion is formed.

In the present specification, "film thickness" indicates, for example, a difference between an inner diameter and an outer diameter of the component formed in the memory hole MH or the SGD hole SH. The "inner diameter" and the "outer diameter" of a layer mean averages of inner diameters and outer diameters of the corresponding layer in cross section in the XY plane, respectively. It should be noted that "diameter" may be used in any meaning of "inner diameter" and "outer diameter".

In the present specification, a "facing portion" corresponds to a portion of two components adjacent in the direction parallel to the surface of the semiconductor substrate 20. For example, the portion of the semiconductor layer 31 facing the conductor layer 23 corresponds to the portion of the semiconductor layer 31 in the layer in which the conductor layer 23 is formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.
example.

What is claimed is:

1. A semiconductor storage device comprising:
   a plurality of first conductor layers stacked in a first direction;
   a first semiconductor layer extending in the first direction through the plurality of first conductor layers;
   a first charge storage layer disposed between the plurality of first conductor layers and the first semiconductor layer;
   a second conductor layer disposed above an uppermost layer of the plurality of first conductor layers;

a second semiconductor layer extending in the first direction through the second conductor layer and electrically connected to the first semiconductor layer;
a third conductor layer disposed between the second semiconductor layer and the second conductor layer, the third conductor layer electrically connected to the second conductor layer;
a first insulator layer disposed above the third conductor layer; and
a second insulator layer including a first portion disposed between the second semiconductor layer and the third conductor layer, and including a second portion disposed between the second semiconductor layer and the first insulator layer, the second insulator layer being a continuous film from at least the first portion to the second portion, wherein
the first portion of the second insulator layer has a first diameter, the second portion of the second insulator layer has a second diameter, and the second diameter is greater than the first diameter.

2. The semiconductor storage device according to claim 1, wherein
the second semiconductor layer includes a first portion extending along the first portion of the second insulator layer and a second portion extending along the second portion of the second insulator layer, the second semiconductor layer is a continuous film from the first portion of the second semiconductor layer to the second portion of the second semiconductor layer, and wherein a diameter of second portion of the second semiconductor layer is less than a diameter of the first portion of the second semiconductor layer.

3. The semiconductor storage device according to claim 1, further comprising:
a third insulator layer that divides the second conductor layer into two portions, the third insulator layer and being in contact with the third conductor layer.

4. The semiconductor storage device according to claim 1, wherein
the second insulator layer includes a second charge storage layer.

5. The semiconductor storage device according to claim 1, further comprising:
a fourth insulator layer that divides each of the plurality of first conductor layers and the second conductor layer into two portions.

6. A semiconductor storage device comprising:
a stacked body including a plurality of first conductor layers stacked in a first direction;
a first semiconductor layer extending in the first direction through the plurality of first conductor layers;
a first charge storage layer disposed between the plurality of first conductor layers and the first semiconductor layer;
a second conductor layer disposed above the stacked body;
a second semiconductor layer extending in the first direction through the second conductor layer and electrically coupled to the first semiconductor layer;
a third conductor layer disposed between the second semiconductor layer and the second conductor layer, the third conductor layer being electrically coupled to the second conductor layer;
a first insulator layer disposed above the second conductor layer; and
a second insulator layer including a first portion disposed between the second semiconductor layer and the third conductor layer and a second portion disposed between the second semiconductor layer and the first insulator layer, the second insulator layer being a continuous film from the first portion to the second portion and being in contact with an upper surface of the third conductor layer.

7. The semiconductor storage device according to claim 6, wherein
a diameter of the second portion of the second insulator layer is less than a diameter of the first portion of the second insulator layer.

8. The semiconductor storage device according to claim 6, wherein
the second semiconductor layer includes a first portion along the first portion of the second insulator layer and a second portion along the second portion of the second insulator layer, the second semiconductor layer is a continuous film from the first portion of the second semiconductor layer to the second portion of the second semiconductor layer, and wherein a diameter of second portion of the second semiconductor layer is less than a diameter of the first portion of the second semiconductor layer.

9. The semiconductor storage device according to claim 6, further comprising:
a third insulator layer that divides the second conductor layer into two portions, the third insulator layer being in contact with the third conductor layer and the second insulator layer.

10. The semiconductor storage device according to claim 6, wherein
the second insulator layer includes a second charge storage layer.

11. The semiconductor storage device according to claim 6, further comprising:
a fourth insulator layer that divides the plurality of first conductor layers and the second conductor layer into two portions.

12. A method of manufacturing a semiconductor storage device, the method comprising:
forming a stacked body including a plurality of first sacrificial materials stacked in a first direction;
forming a pillar including a first semiconductor layer extending in the first direction through the stacked body and a first charge storage layer disposed between the plurality of first sacrificial materials and the first semiconductor layer;
forming a second sacrificial material above the stacked body, and forming a hole extending through the second sacrificial material in the first direction;
sequentially forming a first conductor layer and a third sacrificial material in the hole, and then removing a portion of the third sacrificial material and a portion of the first conductor layer to expose a side wall of the hole, the removed portion of the third sacrificial material and the removed portion of the first conductor layer extending from an upper end of the hole to a predetermined depth;
forming a first insulator layer along the side wall of the hole to be thicker than the first conductor layer, and then removing a remaining portion of the third sacrificial material; and
removing a portion of the first conductor layer formed at a lower end of the hole.

13. The method according to claim 12, further comprising:
   forming a second insulator layer in the hole after removing the portion of the first conductor layer;
   removing a portion of the second insulator layer at the lower end of the hole to expose the first semiconductor layer; and
   forming a second semiconductor layer in the hole that exposes the first semiconductor layer.

14. The method according to claim 13, further comprising:
   forming the second semiconductor layer, and then removing the second sacrificial material and forming a second conductor in a part of a region from which the second sacrificial material is removed.

15. The method according to claim 12, further comprising:
   before forming the hole, forming a slit for dividing the second sacrificial material and forming a third insulator layer in the slit, wherein
   forming the hole includes exposing the third insulator layer to a sidewall of the hole.

16. The method according to claim 13, further comprising:
   after removing the portion of the first conductor layer and before forming the second insulator layer, removing the first insulator layer.

17. The method according to claim 16, wherein
   forming the second insulator layer includes covering an upper surface of the first conductor layer with the second insulator layer.

* * * * *